United States Patent
Anderson et al.

(10) Patent No.: US 12,490,465 B2
(45) Date of Patent: Dec. 2, 2025

(54) STACKED FIELD EFFECT TRANSISTOR

(71) Applicant: INTERNATIONAL BUSINESS MACHINES CORPORATION, Armonk, NY (US)

(72) Inventors: Brent A. Anderson, Jericho, VT (US); Ruilong Xie, Niskayuna, NY (US); Albert M. Young, Fishkill, NY (US); Albert M. Chu, Nashua, NH (US)

(73) Assignee: International Business Machines Corporation, Armonk, NY (US)

( * ) Notice: Subject to any disclaimer, the term of this patent is extended or adjusted under 35 U.S.C. 154(b) by 662 days.

(21) Appl. No.: 17/806,292

(22) Filed: Jun. 10, 2022

(65) Prior Publication Data
US 2023/0402519 A1 Dec. 14, 2023

(51) Int. Cl.
*H10D 84/00* (2025.01)
*H10D 30/67* (2025.01)
*H10D 84/01* (2025.01)
*H10D 88/00* (2025.01)

(52) U.S. Cl.
CPC ..... *H10D 30/6735* (2025.01); *H10D 84/0149* (2025.01); *H10D 88/00* (2025.01); *H10D 88/01* (2025.01); *H10D 30/6757* (2025.01)

(58) Field of Classification Search
CPC .. H10D 84/83; H10D 84/8311; H10D 84/832; H10D 84/0126; H10D 84/0128; H10D 84/0149; H10D 30/6735; H10D 30/121; H01L 25/074
See application file for complete search history.

(56) References Cited

U.S. PATENT DOCUMENTS

| | | | |
|---|---|---|---|
| 9,659,963 | B2 | 5/2017 | Cheng |
| 9,837,414 | B1 | 12/2017 | Balakrishnan |
| 10,192,819 | B1 | 1/2019 | Chanemougame |
| 10,192,867 | B1 | 1/2019 | Frougier |
| 10,510,622 | B1 | 12/2019 | Frougier |
| 10,985,064 | B2 | 4/2021 | Zhang |
| 11,264,327 | B2 | 3/2022 | Chiang |
| 2019/0131396 | A1* | 5/2019 | Zhang ............... B82Y 10/00 |
| 2021/0202385 | A1 | 7/2021 | Huang |
| 2021/0351303 | A1 | 11/2021 | Ju |
| 2021/0366906 | A1 | 11/2021 | Huang |
| 2021/0366907 | A1 | 11/2021 | Liao |

* cited by examiner

*Primary Examiner* — Reema Patel
(74) *Attorney, Agent, or Firm* — Jeffrey M. Ingalls

(57) ABSTRACT

A semiconductor device is provided. The semiconductor device includes a bottom field effect transistor (FET) including a bottom source-drain epitaxial layer formed on sides of the bottom FET; a top FET stacked over the bottom FET; a back-end-of-line (BEOL) layer formed on the top FET; a bottom gate contact formed in contact with the bottom FET and having an extending portion of the bottom gate contact that extends laterally over the bottom source-drain epitaxial layer; and a top gate contact formed in contact with the extending portion of the bottom gate contact and electrically connecting the bottom gate contact to the BEOL layer.

20 Claims, 31 Drawing Sheets

STACKED FIELD EFFECT TRANSISTOR

BACKGROUND

The present disclosure relates to fabrication methods and resulting structures for semiconductor devices. More specifically, the present disclosure relates to fabrication methods and resulting structures for field effect transistors (FETs) with stacked n-type and p-type nanosheets for complementary metal oxide semiconductor (CMOS) technologies.

In certain semiconductor device fabrication processes, a large number of semiconductor devices, such as n-type field effect transistors (nFETs) and p-type field effect transistors (pFETs), may be fabricated on a single wafer. Non-planar transistor device architectures (e.g., fin-type FETs (FinFETs) and nanosheet FETs) can provide increased device density and increased performance over planar transistors. As semiconductor integrated circuits (ICs) and/or chips become smaller, the implementation of stacked nanosheets in semiconductor devices has increased. Nanosheets generally refer to two-dimensional nanostructures with a thickness range on the order of about 1 nanometer (nm) to about 100 nm, and they can facilitate the fabrication of non-planar semiconductor devices having a reduced footprint compared to conventional planar-type semiconductor devices. For example, nanosheet transistors, in contrast to conventional planar FETs, include a gate stack that wraps around the full perimeter of multiple stacked nanosheet channel regions for a reduced device footprint and improved control of channel current flow. Nanosheet transistor configurations may enable fuller depletion in the nanosheet channel regions and reduce short-channel effects. Accordingly, nanosheets and nanowires are seen as feasible options for reducing the footprints of semiconductor transistor devices to 7 nanometers or less. One way to continue improve the transistor density is to fabricate stacked FETs, where one device stacks over another device, such that transistor density at given footprint is increased. Stacked FET include all combinations of device choices: such as nanosheet over nanosheet, FinFET over nanosheet, FinFET over FinFET, etc.

SUMMARY

Embodiments of the present disclosure relate to a semiconductor device. The semiconductor device includes a bottom field effect transistor (FET) including a bottom source-drain epitaxial layer formed on sides of the bottom FET; a top FET stacked over the bottom FET; a back-end-of-line (BEOL) layer formed on the top FET; a bottom gate contact formed in contact with the bottom FET and having an extending portion of the bottom gate contact that extends laterally over the bottom source-drain epitaxial layer; and a top gate contact formed in contact with the extending portion of the bottom gate contact and electrically connecting the bottom gate contact to the BEOL layer.

Embodiments of the present disclosure relate to a method of manufacturing a semiconductor device. The method includes forming a bottom field effect transistor (FET) including a bottom source-drain epitaxial layer on sides of the bottom FET; forming a top FET stacked over the bottom FET; forming a back-end-of-line (BEOL) layer on the top FET; forming a bottom gate contact in contact with the bottom FET and having an extending portion of the bottom gate contact that extends laterally over the bottom source-drain epitaxial layer; and forming a top gate contact in contact with the extending portion of the bottom gate contact and electrically connecting the bottom gate contact to the BEOL layer.

The above summary is not intended to describe each illustrated embodiment or every implementation of the present disclosure.

BRIEF DESCRIPTION OF THE DRAWINGS

The drawings included in the present application are incorporated into, and form part of, the specification. They illustrate embodiments of the present disclosure and, along with the description, explain the principles of the disclosure. The drawings are only illustrative of certain embodiments and do not limit the disclosure.

DETAILED DESCRIPTION

Figure 1A:
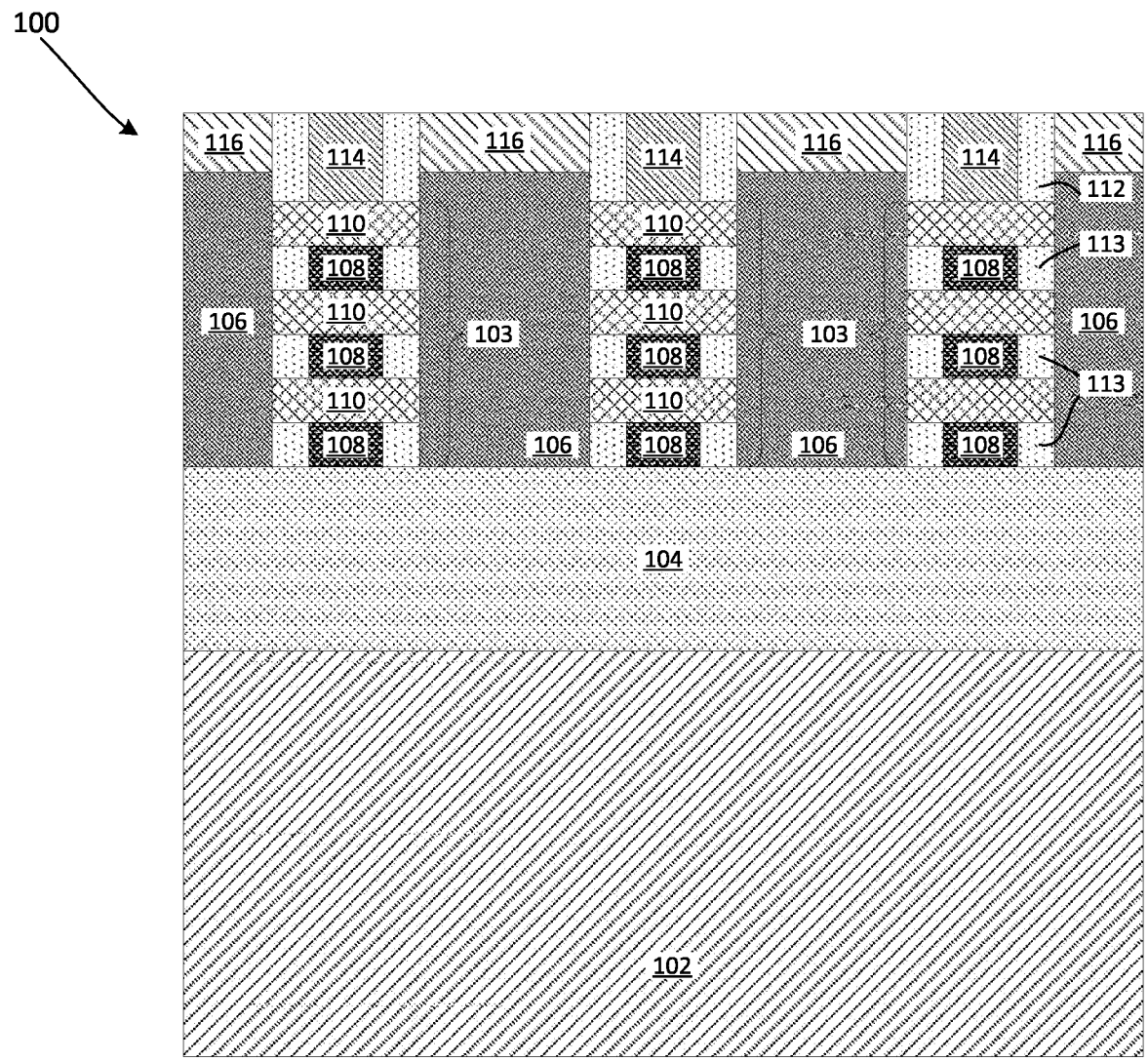
FIG. 1A is a cross-sectional view of a semiconductor device at an intermediate stage of the fabrication process and taken along the X line of FIG. 1D, according to embodiments.

The present disclosure describes stacked FET devices and methods of manufacturing the stacked FET devices. In particular, the present disclosure describes stacked nanosheet FET devices and the particular contact wiring structures formed therein.

In certain examples, forming contact wirings for stacked FET devices may have certain challenges. Contacts (or contact wirings) can be formed by simply extending the gate and the source/drain (S/D) regions. However, that increases the cell height for the device which may not be desirable. It may be difficult to connect the bottom gate (if that is an independent gate device) to the BEOL interconnect without increasing the gate extension to the active area (RX), which would result in an increase in cell height.

Therefore, it may be desirable to manufacture stacked FET structures by forming a bottom device, forming a gate contact placeholder that is extended over at least a bottom S/D epitaxial region, forming the top device, forming a replacement gate (including the gate contact placeholder), forming a top contact over the said gate contact placeholder to wire the bottom gate out, and forming a backside contact to the bottom S/D epitaxial layer which has a gate contact placeholder over it.

The flowcharts and cross-sectional diagrams in the Figures illustrate methods of manufacturing stacked FET devices according to various embodiments. In some alternative implementations, the manufacturing steps may occur in a different order that that which is noted in the Figures, and certain additional manufacturing steps may be implemented between the steps noted in the Figures. Moreover, any of the layered structures depicted in the Figures may contain multiple sublayers.

Various embodiments of the present disclosure are described herein with reference to the related drawings. Alternative embodiments can be devised without departing from the scope of the present disclosure. It is noted that various connections and positional relationships (e.g., over, below, adjacent, etc.) are set forth between elements in the following description and in the drawings. These connections and/or positional relationships, unless specified otherwise, can be direct or indirect, and the present disclosure is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements. It should be noted, the term "selective to," such as, for example, "a first element selective to a second element," means that a first element can be etched, and the second element can act as an etch stop.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

Turning now to an overview of technologies that are more specifically relevant to aspects of the present disclosure, a metal-oxide-semiconductor field-effect transistor (MOSFET) may be used for amplifying or switching electronic signals. The MOSFET has a source electrode, a drain electrode, and a metal oxide gate electrode. The metal gate portion of the metal oxide gate electrode is electrically insulated from the main semiconductor n-channel or p-channel by a thin layer of insulating material, for example, silicon dioxide or glass, which makes the input resistance of the MOSFET relatively high. The gate voltage controls whether the current path from the source to the drain is an open circuit ("off") or a resistive path ("on"). N-type field effect transistors (nFET) and p-type field effect transistors (pFET) are two types of complementary MOSFETs. The nFET includes n-doped source and drain junctions and uses electrons as the current carriers. The pFET includes p-doped source and drain junctions and uses holes as the current carriers. Complementary metal oxide semiconductor (CMOS) is a technology that uses complementary and symmetrical pairs of p-type and n-type MOSFETs to implement logic functions. As mentioned above, hole mobility on the pFET may have an impact on overall device performance.

The wafer footprint of an FET is related to the electrical conductivity of the channel material. If the channel material has a relatively high conductivity, the FET can be made with a correspondingly smaller wafer footprint. One method of increasing channel conductivity and decreasing FET size is to form the channel as a nanostructure. For example, a so-called gate-all-around (GAA) nanosheet FET is a known architecture for providing a relatively small FET footprint by forming the channel region as a series of nanosheets. In a known GAA configuration, a nanosheet-based FET includes a source region, a drain region and stacked nanosheet channels between the source and drain regions. Semiconductor nanosheet FET devices typically include one or more suspended nanosheets that serve as the channel. A gate surrounds the stacked nanosheet channels and regulates electron flow through the nanosheet channels between the source and drain regions. GAA nanosheet FETs are fabricated by forming alternating layers of channel nanosheets and sacrificial nanosheets. The sacrificial nanosheets are released from the channel nanosheets before the FET device is finalized. For n-type FETs, the channel nanosheets are typically silicon (Si) and the sacrificial nanosheets are typically silicon germanium (SiGe). For p-type FETs, the channel nanosheets can be SiGe and the sacrificial nanosheets can be Si. In some implementations, the channel nanosheet of a p-type FET can be SiGe or Si, and the sacrificial nanosheets can be Si or SiGe. Forming the GAA nanosheets from alternating layers of channel nanosheets formed from a first type of semiconductor material (e.g., Si for n-type FETs, and SiGe for p-type FETs) and sacrificial nanosheets formed from a second type of semiconductor material (e.g., SiGe for n-type FETs, and Si for p-type FETs) provides superior channel electrostatics control, which is necessary for continuously scaling gate lengths down to seven (7) nanometer CMOS technology and below.

An epitaxy process is typically performed to grow source/drain epitaxy structures from the surface of the wafer to contact the opposing ends of the nanosheets. A metal source/drain contact is then typically formed on the upper surface of the source/drain epitaxy structure to provide the final source/drain contacts of the device. The use of multiple layered SiGe/Si sacrificial/channel nanosheets (or Si/SiGe sacrificial/channel nanosheets) to form the channel regions in GAA FET semiconductor devices provides desirable device characteristics, including the introduction of strain at the interface between SiGe and Si. Moreover, as fabrication trends aim to continue reducing the footprints of semiconductor devices, the total contact area between the upper surface of the source/drain epitaxy structure and the lower surface of the metal source/drain contact may be reduced.

Figure 1B:
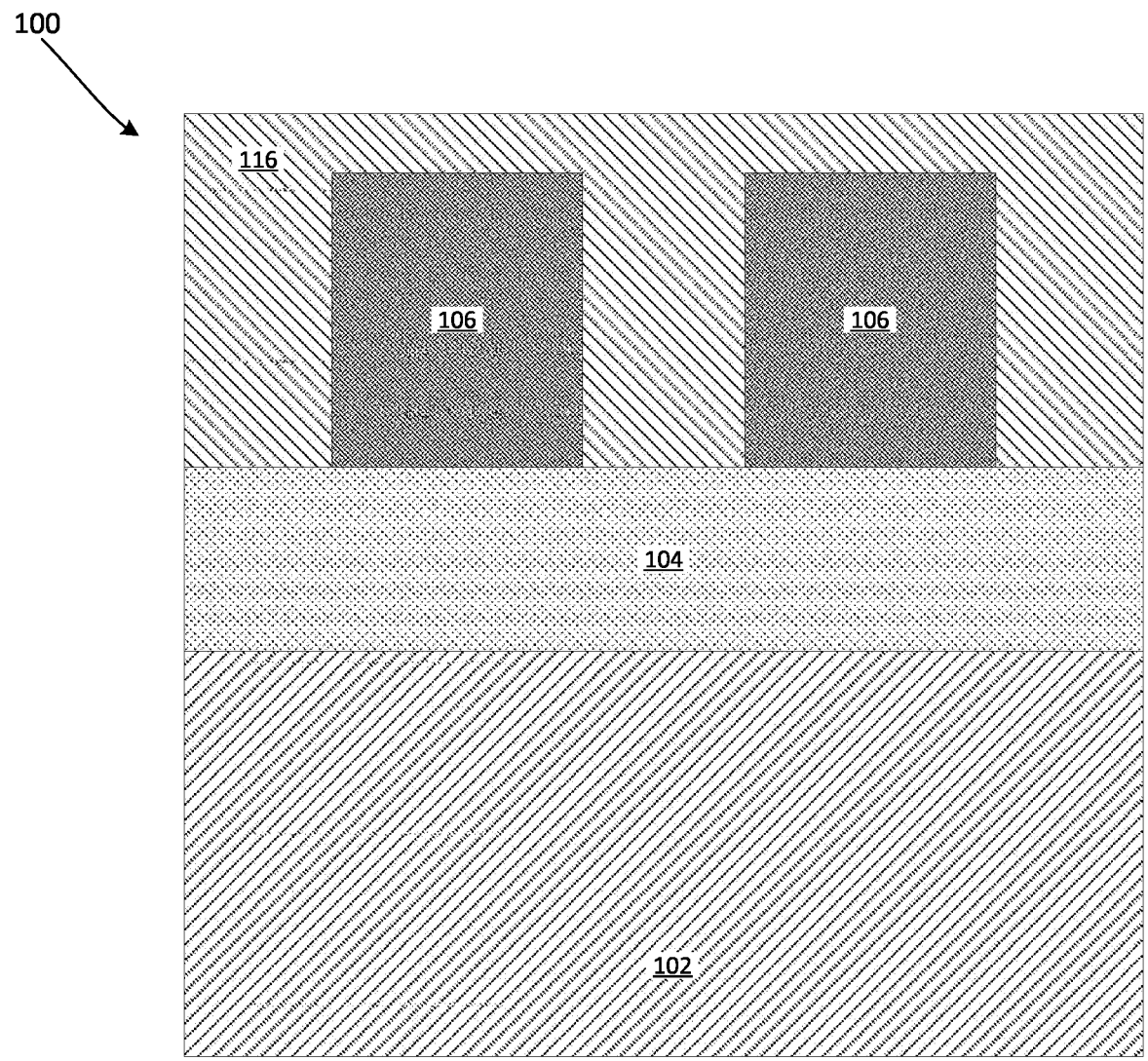
FIG. 1B is a cross-sectional view of the semiconductor device at an intermediate stage of the fabrication process and taken along the Y1 line of FIG. 1D, according to embodiments.
Figure 1C:
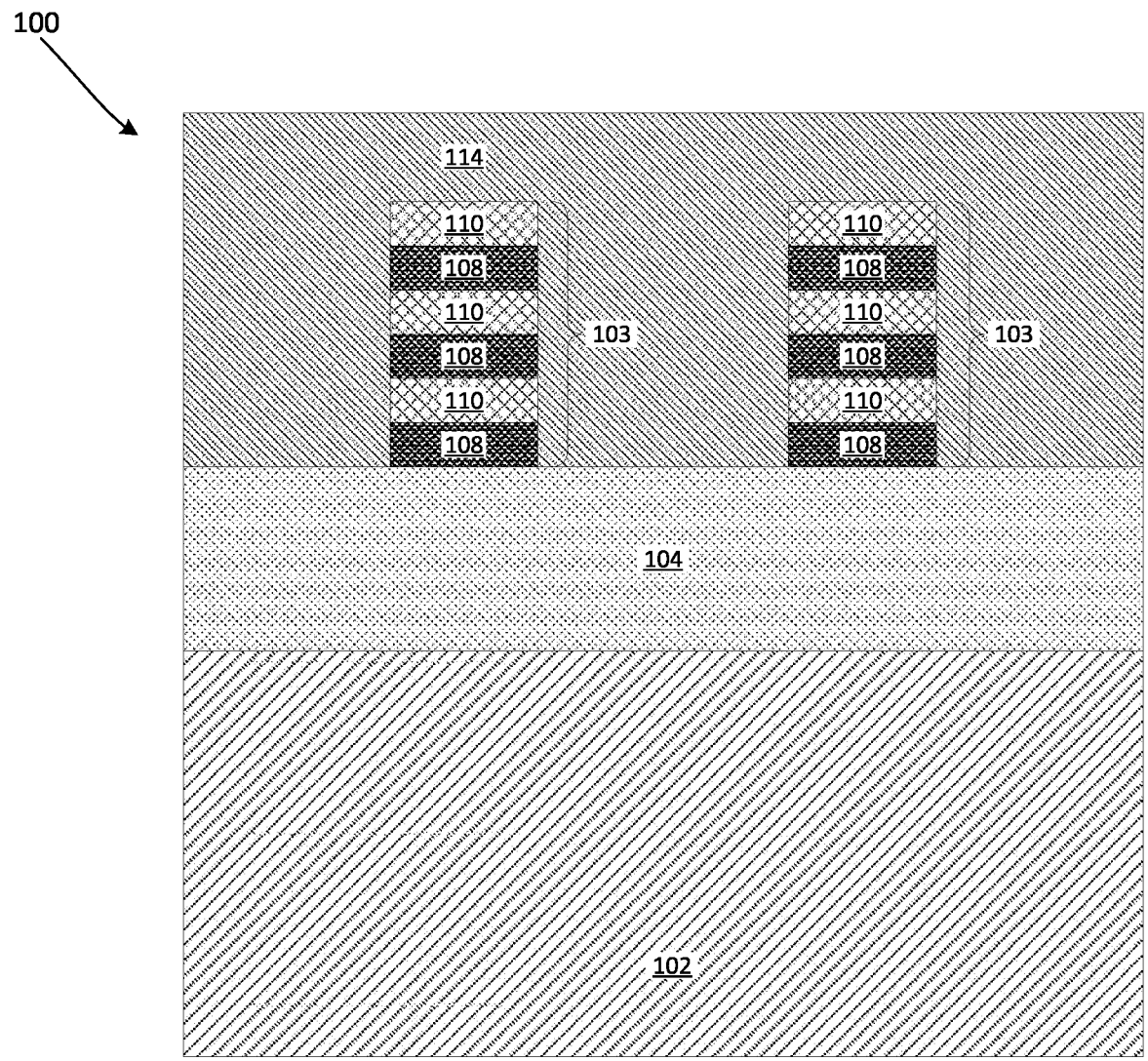
FIG. 1C is a cross-sectional view of the semiconductor device at an intermediate stage of the fabrication process and taken along the Y2 line of FIG. 1D, according to embodiments.
Figure 1D:
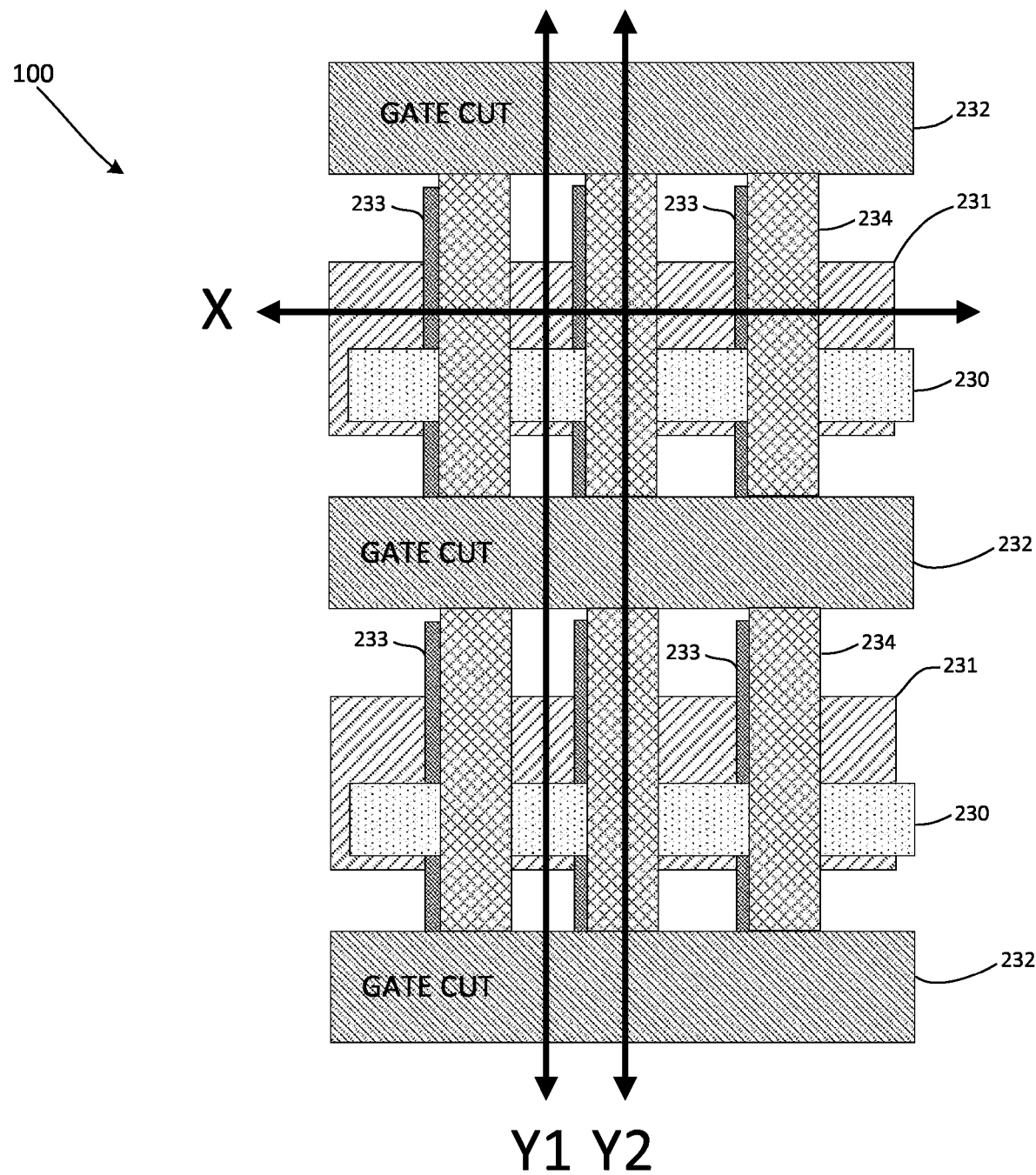
FIG. 1D is a top view of the semiconductor device of FIGS. 1A, 1B and 1C, according to embodiments.

Referring now to the drawings and initially to FIG. 1A, this figure depicts a cross-sectional view of the semiconductor device 100 shown in FIG. 1D taken along line X, according to embodiments. As shown in FIG. 1A, a substrate 102 is provided. The substrate 102 may be a bulk-semiconductor substrate. In one example, the bulk-semiconductor substrate may be a silicon-containing material. Illustrative examples of silicon-containing materials suitable for the bulk-semiconductor substrate include, but are not limited to, silicon, silicon germanium, silicon germanium carbide, silicon carbide, polysilicon, epitaxial silicon, amorphous silicon, and multi-layers thereof. Although silicon is the predominantly used semiconductor material in wafer fabrication, alternative semiconductor materials can be employed, such as, but not limited to, germanium, gallium arsenide, gallium nitride, cadmium telluride, and zinc selenide. Although not depicted in the present figures, the semiconductor substrate 102 may also be a semiconductor on insulator (SOI) substrate. The substrate 102 may be comprised of any other suitable material(s) from those listed above.

As shown in FIG. 1A, an oxide layer is formed on the underlying substrate 102. When the buried insulator is an oxide layer it is referred to herein as a buried oxide or BOX layer 104. The BOX layer 104 isolates the source/drain regions from the substrate 102 and/or isolates the nanosheet region from the substrate 102. As shown in the cross-sectional view of FIG. 1A, the buried oxide layer 104 is formed on top of the underlying substrate 102. In certain embodiments, a sacrificial epitaxial layer (not shown) is first formed on the substrate 102 in place of BOX layer 104 as part of the epitaxy stack. The sacrificial epitaxial layer may be comprised of, for example, SiGe with Ge concentration ranging from 50% to 75%, or any other suitable material. It is then selectively removed and replaced by a dielectric material during downstream processing to create a continuous isolation layer under the source-drain and gate regions of active FET devices.

As shown in FIGS. 1A and 1C (a cross-sectional view of the semiconductor device 100 shown in FIG. 1D taken along line Y2), a nanosheet stack 103 having multiple layers is formed on the BOX layer 104. The nanosheet stack 103 includes a sacrificial layer 108, followed by the formation of an active semiconductor layer 110. In certain examples, the first one of the sacrificial layers 108 (i.e., the bottommost sacrificial layer) is initially formed directly on an upper surface of the BOX layer 104. In other examples, certain layers may replace the BOX and is formed between the upper surface of the substrate 102 and the first one of the sacrificial layers 108. In an example, the sacrificial layer 108 is composed of silicon-germanium (e.g., SiGe35, or more generally, where the Ge ranges from about 15-35%). Next, an active semiconductor layer 110 is formed on an upper surface of the first one of the sacrificial layers 108. In an example, the active semiconductor layer 110 is composed of silicon. Several additional layers of the sacrificial layer 108 and the active semiconductor layer 110 are alternately formed. In the example illustrated in FIGS. 1A and 1C, there are a total of three sacrificial layers 108 and three active semiconductor layers 110 that are alternately formed to form the nanosheet stack 103. However, it should be appreciated that any suitable number of alternating layers may be formed.

In certain embodiments, the sacrificial layers 108 have a vertical thickness ranging, for example, from approximately 3 nm to approximately 20 nm. In certain embodiments, the active semiconductor layers 110 have a vertical thickness ranging, for example, from approximately 3 nm to approximately 10 nm. Although six total layers are illustrated in FIGS. 1A and 1C, it should be appreciated that the nanosheet stack 103 can include any suitable number of layers. Although the range of 3-20 nm is cited as an example range of thickness, other thicknesses of these layers may be used. In certain examples, certain of the sacrificial layers 108 or the active semiconductor layers 110 may have different thicknesses relative to one another. Therefore, multiple epitaxial growth processes can be performed to form the alternating sacrificial layers 108 and the active semiconductor layers 110.

In certain embodiments, it may be desirable to have a small vertical spacing (VSP) between adjacent nanosheet layers in a stack of nanosheets to reduce the parasitic capacitance and to improve circuit speed. For example, the VSP (the distance between the bottom surface of a first nanosheet layer and the top surface of an adjacent second nanosheet layer) may range from 5 nm to 15 nm. However, the VSP must be of a sufficient value to accommodate the gate stack that will be formed in the spaces created by later removal of the sacrificial layers 108.

As shown in FIG. 1A, following the formation of the nanosheet stack 103 (e.g., all of the sacrificial layers 108 and semiconductor layers 110) a dummy gate 114 is formed on the topmost active semiconductor layer 110 (and around the nanosheet shack 103 as shown in FIG. 1C) by any suitable deposition and/or patterning process. The dummy gate 114 may be formed by any suitable deposition technique known to one of skill in the art. In one example, the dummy gate 114 is formed by depositing a thin $SiO_2$ dummy gate oxide layer (not shown), followed by depositing a layer of amorphous silicon (a-Si) as the dummy gate 114. The dummy gate 114 may be composed of polycrystalline silicon (poly silicon), amorphous silicon, and/or an oxide, such as, $SiO_2$. In certain examples, gate patterning may be performed by first patterning a gate hardmask (not shown) and then using the patterned gate hardmask to etch the dummy gates 114. Following this is the gate spacer 112 formation, and the nanosheet recess process.

As also shown in FIG. 1A, The sacrificial layers 108 are recessed inwards by any suitable material removal process know to one of skill in the art. Thus, in the cross-sectional view shown in FIG. 1A, the sacrificial layers 108 have a width that is less than the width of the active semiconductor layers 110. Then, an inner spacer 113 is conformally deposited in the recessed areas between the sacrificial layers 108 and the active semiconductor layers 110 followed by an isotropic etching process. In certain embodiments, the inner spacer 113 may be comprised of the same materials as the gate spacer 112. In other embodiments, the inner spacer 113 is comprised of different materials from the gate spacer 112.

As shown in FIGS. 1A and 1B (a cross-sectional view of the semiconductor device 100 shown in FIG. 1D taken along line Y1), a source/drain epitaxial layer 106 is formed around the nanosheet stacks 103. Then, an interlayer dielectric (ILD) layer 116 is formed on the source/drain epitaxial layer 106 as shown in FIG. 1A, and the ILD layer 116 is formed around the source/drain epitaxial layer 106 as shown in FIG. 1B.

Referring now to FIG. 1D, this figure depicts a simple diagram of a top view of the semiconductor device 100, according to embodiments. FIG. 1D is only for reference purposes and illustrates a top-down view of locations of the nanosheet stacks 103 (see e.g., FIG. 3) and future gates. For simplicity and ease of understanding, FIG. 1D omits some layers (elements) so as to not obscure the figure. In particular, as shown in FIG. 1D, several gate cuts 232 are shown. Top active regions 230 and bottom active regions 231 are shown (these are shown overlapped and slightly offset for east of illustration and understanding). Also, bottom gates 233 and top gates 234 are shown (they are also shown overlapped and slightly offset for east of illustration and understanding). The surface areas of the top active regions 230 are smaller than the bottom active regions 231 to allow for subsequently forming the contacts to the top and bottom channels, respectively. Moreover, because the top gates 234 overlap the bottom gates 233, it may be challenging to form the contact for the bottom gates 233 without short circuiting to the top gates 234.

Figure 2A:
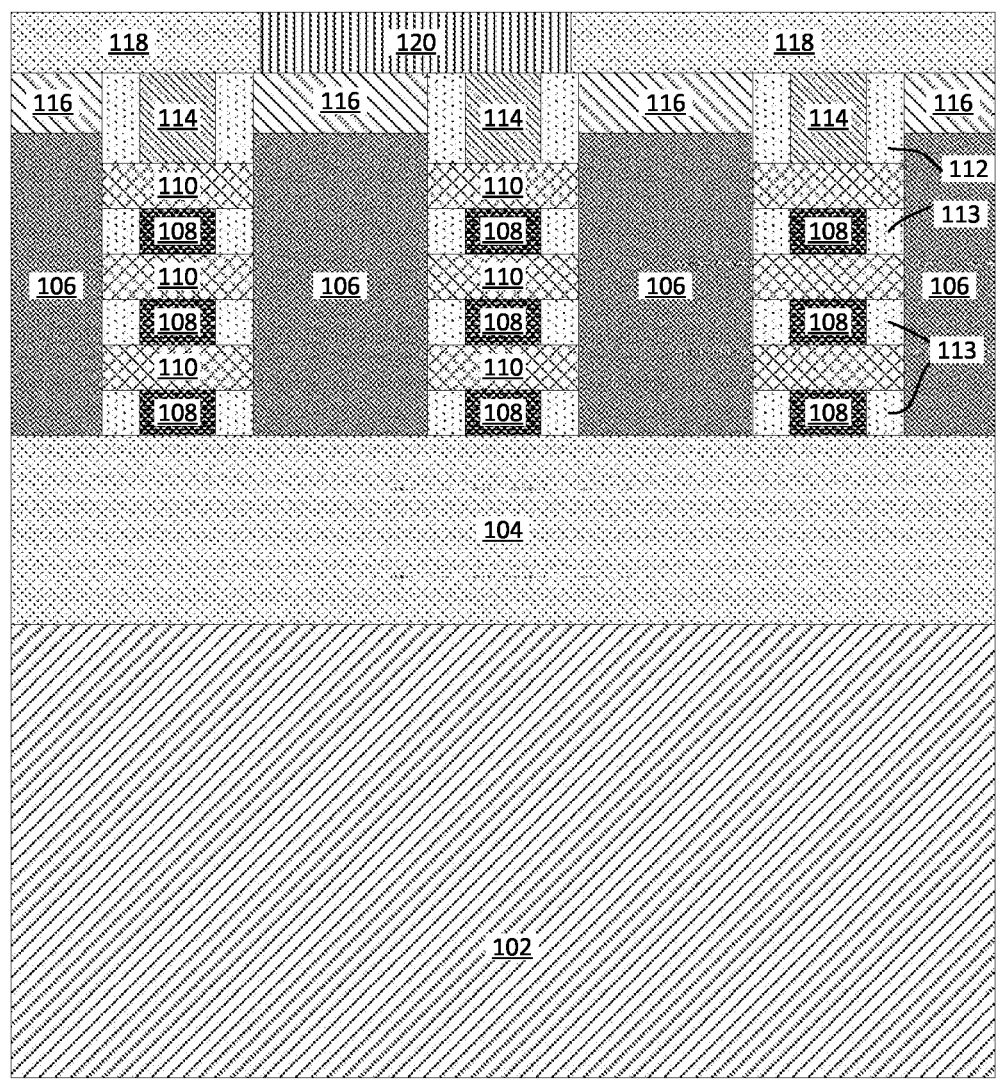
FIG. 2A is a cross-sectional view of the semiconductor device of FIG. 1A after additional fabrication operations and taken along the X line of FIG. 1D, according to embodiments.
Figure 2B:
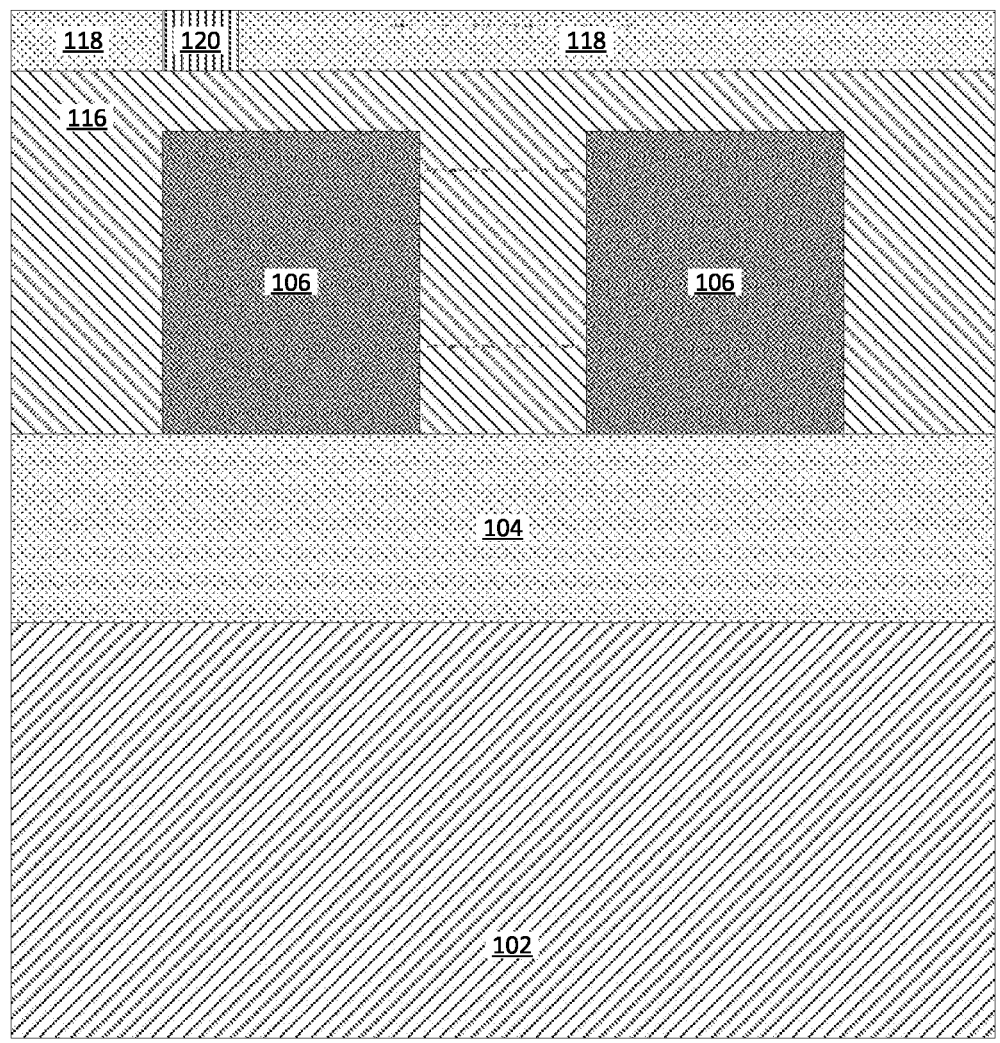
FIG. 2B is a cross-sectional view of the semiconductor device of FIG. 1B after additional fabrication operations and taken along the Y1 line of FIG. 1D, according to embodiments.
Figure 2C:
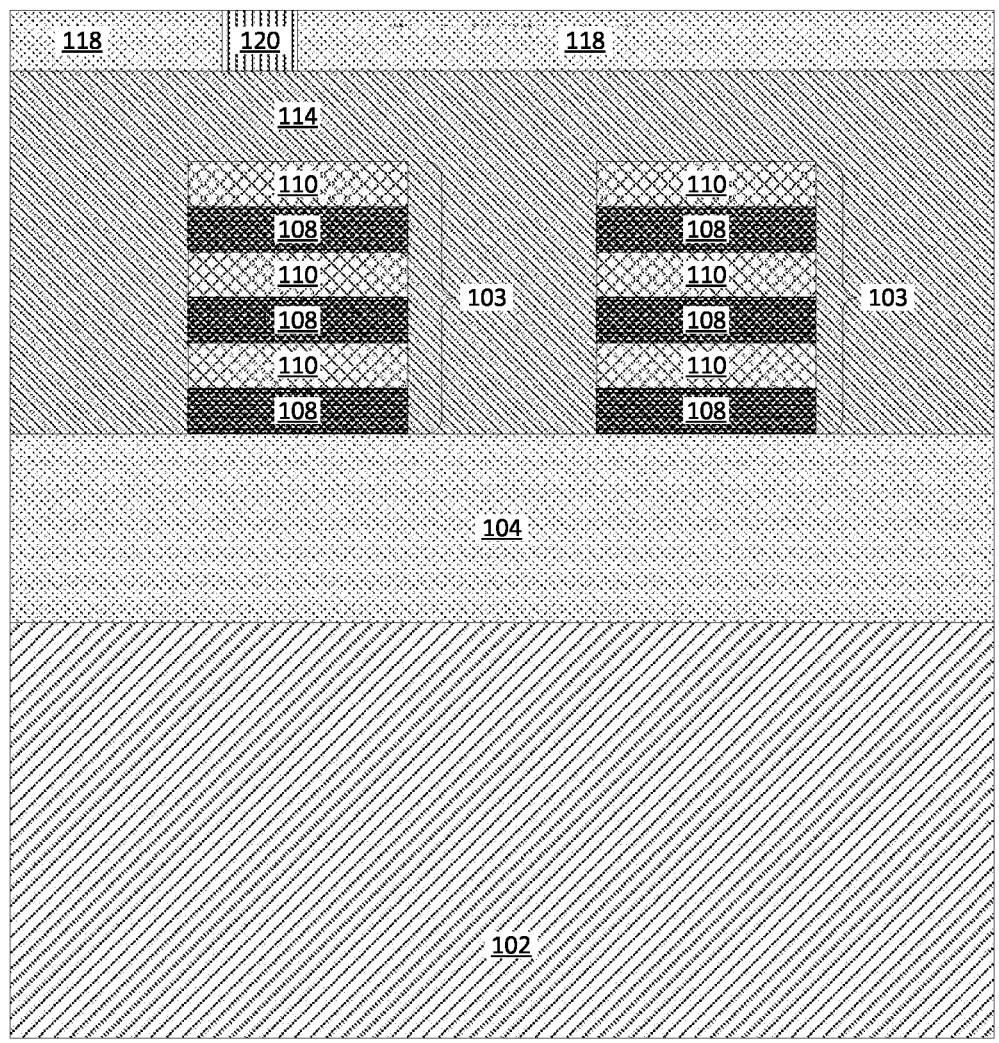
FIG. 2C is a cross-sectional view of the semiconductor device of FIG. 1C after additional fabrication operations and taken along the Y2 line of FIG. 1D, according to embodiments.

FIGS. 2A, 2B and 2C illustrate the process stage after forming the sacrificial gate contact. Referring now to FIG. 2A, this figure depicts a cross-sectional view of the semiconductor device 100 shown in FIG. 1A taken along line X after additional manufacturing operations, according to embodiments. As shown in FIGS. 2A, 2B (a cross-sectional view of the semiconductor device 100 shown in FIG. 1B taken along line Y1 after additional manufacturing operations) and 2C (a cross-sectional view of the semiconductor device 100 shown in FIG. 1C taken along line Y2 after additional manufacturing operations), a first dielectric layer 118 is formed on the ILD layer 116 (as shown in FIGS. 2A and 2B), and on the dummy gate 114 (as shown in FIGS. 1A and 1C). As also shown in FIGS. 2A, 2B and 2C, a sacrificial gate contact 120 (or bottom gate contact or BCB) is formed in the first dielectric layer 118. The sacrificial gate contact 120 may comprise, for example, $TiO_x$, $AlO_x$, etc. This sacrificial gate contact 120 is formed if the connected bottom transistor is an independent gate device. As shown in FIG. 2B, the sacrificial gate contact 120 is formed at a position generally above the left side of the left portion of the source/drain epitaxial layer 106. As shown in FIG. 2C, the sacrificial gate contact 120 is formed at a position generally above the left portion nanosheet stack 103.

Figure 3A:
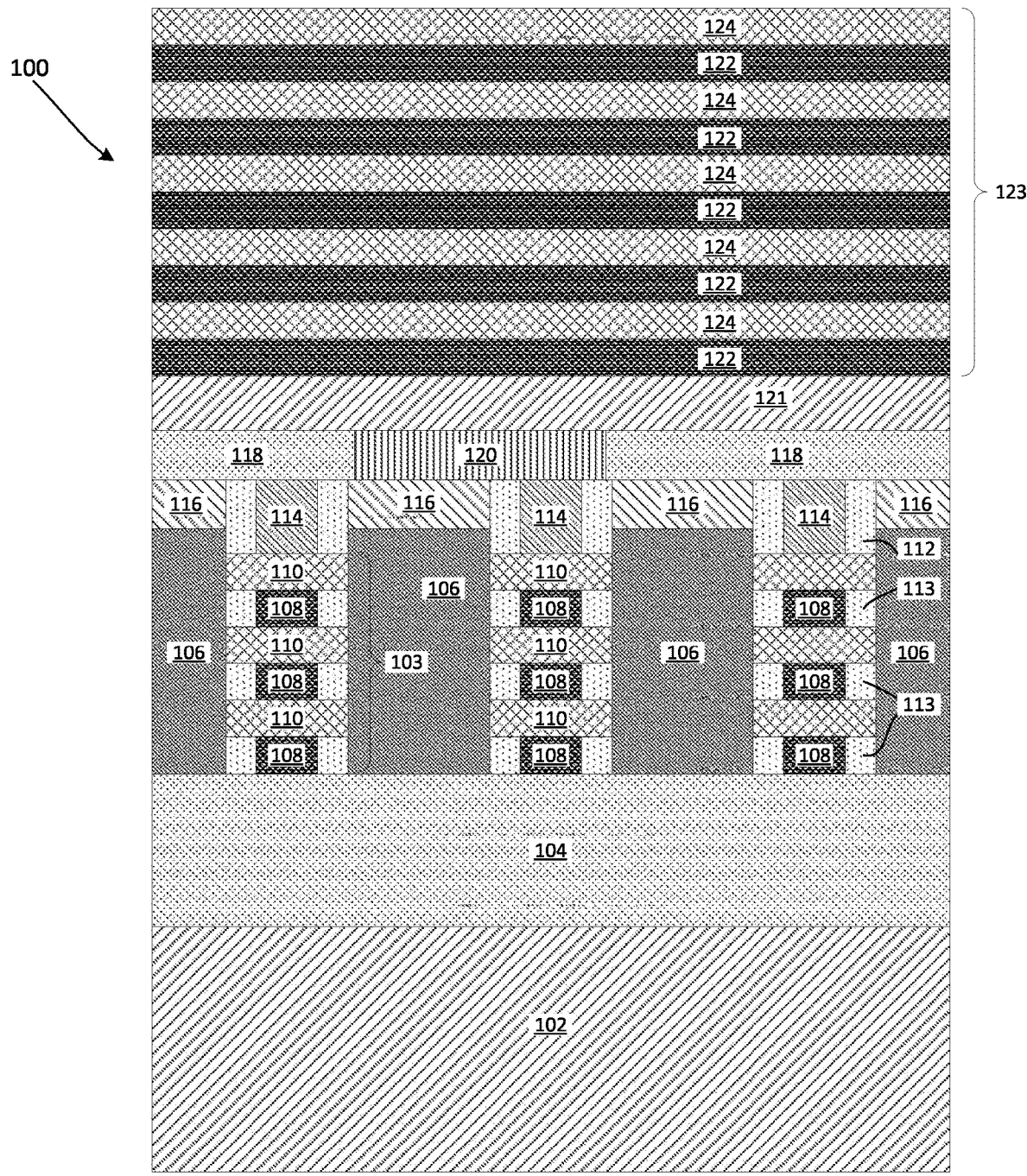
FIG. 3A is a cross-sectional view of the semiconductor device of FIG. 2A after additional fabrication operations and taken along the X line of FIG. 1D, according to embodiments.
Figure 3B:
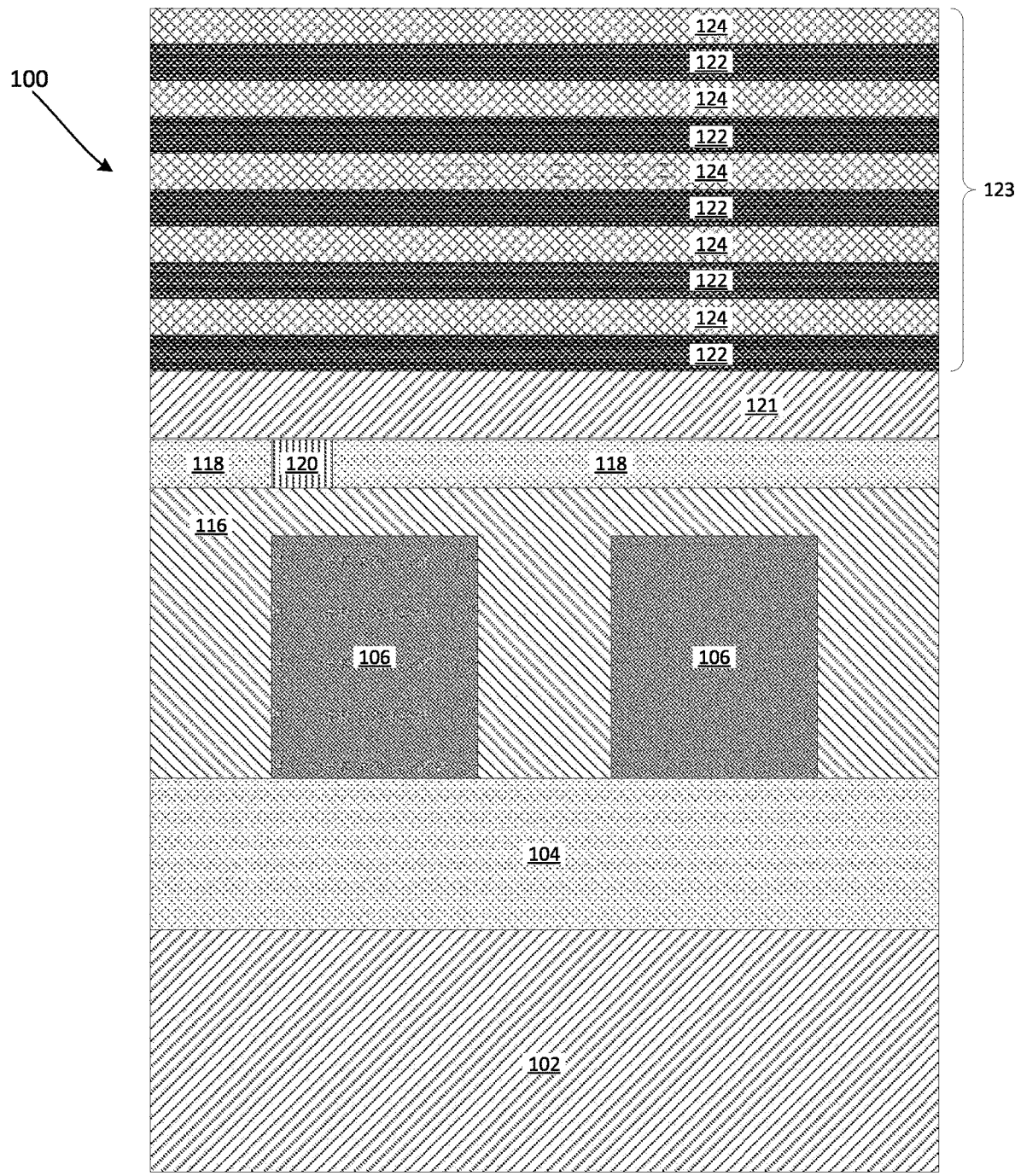
FIG. 3B is a cross-sectional view of the semiconductor device of FIG. 2B after additional fabrication operations and taken along the Y1 line of FIG. 1D, according to embodiments.
Figure 3C:
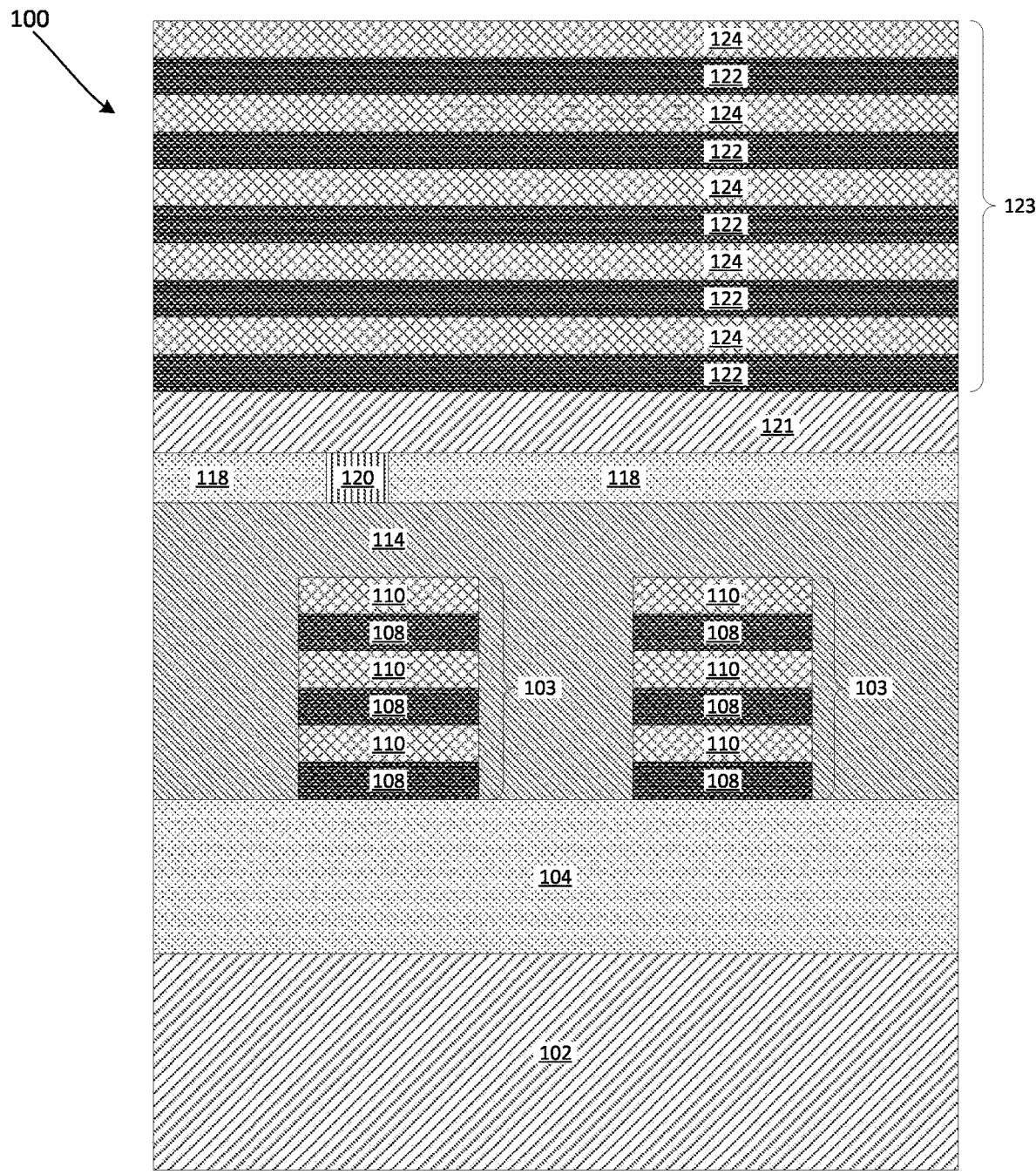
FIG. 3C is a cross-sectional view of the semiconductor device of FIG. 2C after additional fabrication operations and taken along the Y2 line of FIG. 1D, according to embodiments.

FIGS. 3A, 3B, and 3C illustrate top channel material formation by a wafer bonding process. Referring now to FIG. 3A, this figure depicts a cross-sectional view of the semiconductor device 100 shown in FIG. 2A taken along line X after additional manufacturing operations, according to embodiments. As shown in FIGS. 3A, 3B (a cross-sectional view of the semiconductor device 100 shown in FIG. 2B taken along line Y1 after additional manufacturing operations), and FIG. 3C (a cross-sectional view of the semiconductor device 100 shown in FIG. 2C taken along line Y2 after additional manufacturing operations), top channel layers 123 are bonded to the first dielectric layer 118 using a conventional dielectric-to-dielectric bonding process, e.g., oxide-to-oxide bonding (layer 121 is the bonding oxide). After wafer bonding, additional processes can be performed to remove excessive substrate materials for the top wafer. The top channel layers 123 include alternating layers of top sacrificial layers 122 and top active semiconductor layers 124. These top channel layers 123 may be composed of the same or different materials than nanosheet stack 103. In an example, the top sacrificial layer 122 is composed of silicon-germanium (e.g., SiGe35, or more generally, where the Ge ranges from about 15-35%). In an example, the top active semiconductor layer 124 is composed of silicon. Several additional layers of the top sacrificial layer 122 and the top active semiconductor layer 124 are alternately formed. In the example illustrated in FIGS. 3A, 3B and 3C, there are a total of five top sacrificial layers 122 and five top active semiconductor layers 124 that are alternately formed to form the top channel layers 123 (or top nanosheet stack). However, it should be appreciated that any suitable number of alternating layers may be formed.

Figure 4A:
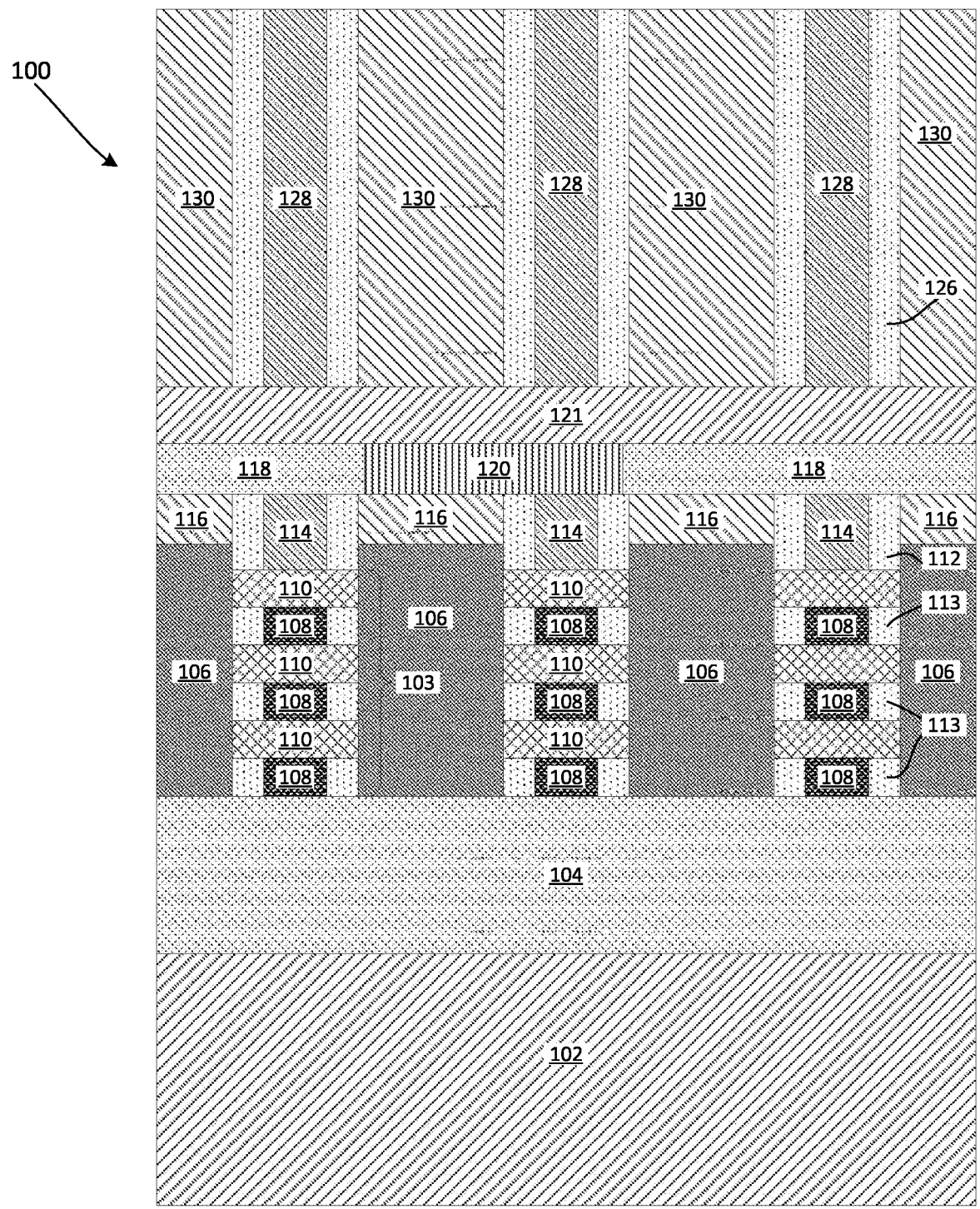
FIG. 4A is a cross-sectional view of the semiconductor device of FIG. 3A after additional fabrication operations and taken along the X line of FIG. 1D, according to embodiments.
Figure 4B:
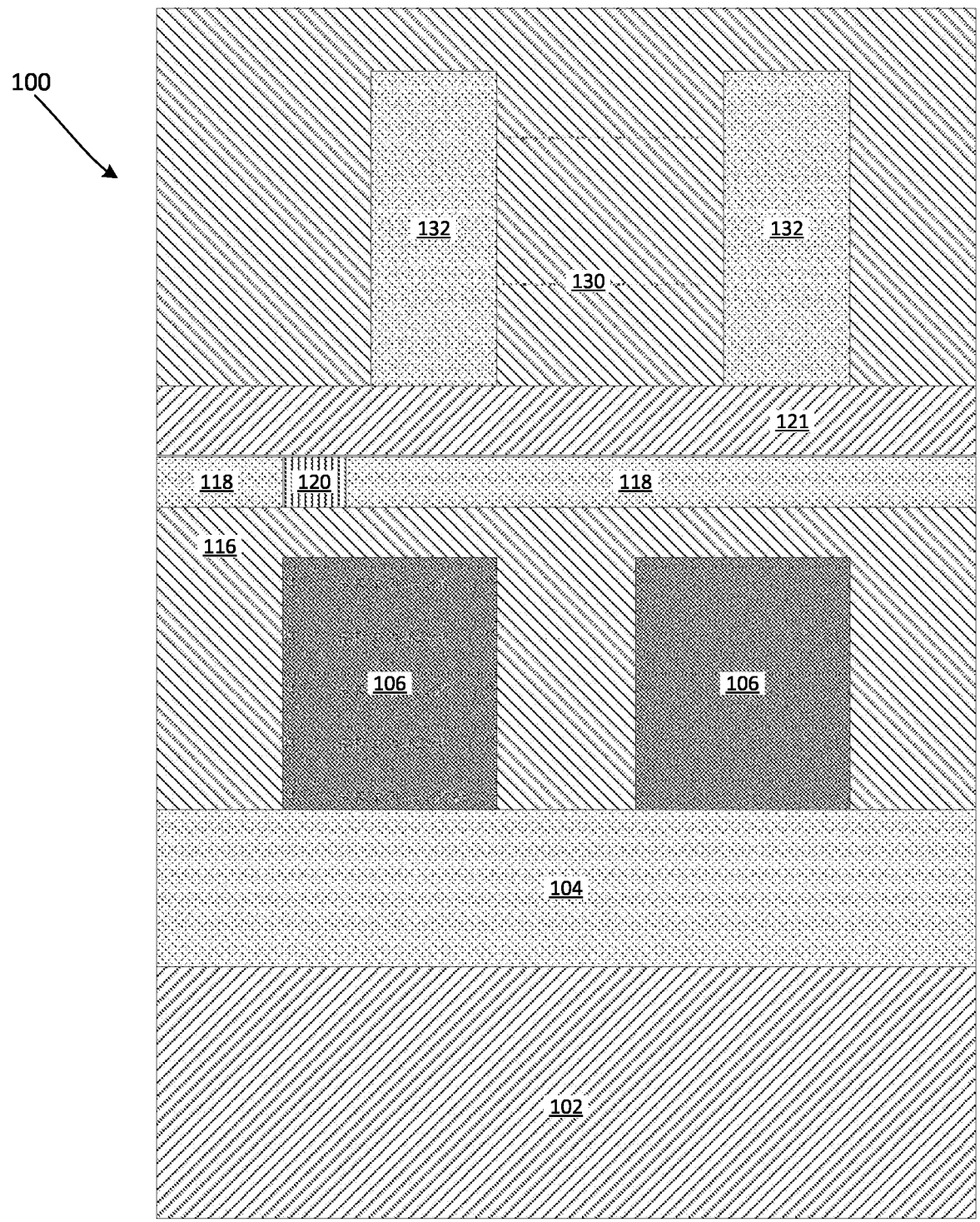
FIG. 4B is a cross-sectional view of the semiconductor device of FIG. 3B after additional fabrication operations and taken along the Y1 line of FIG. 1D, according to embodiments.
Figure 4C:
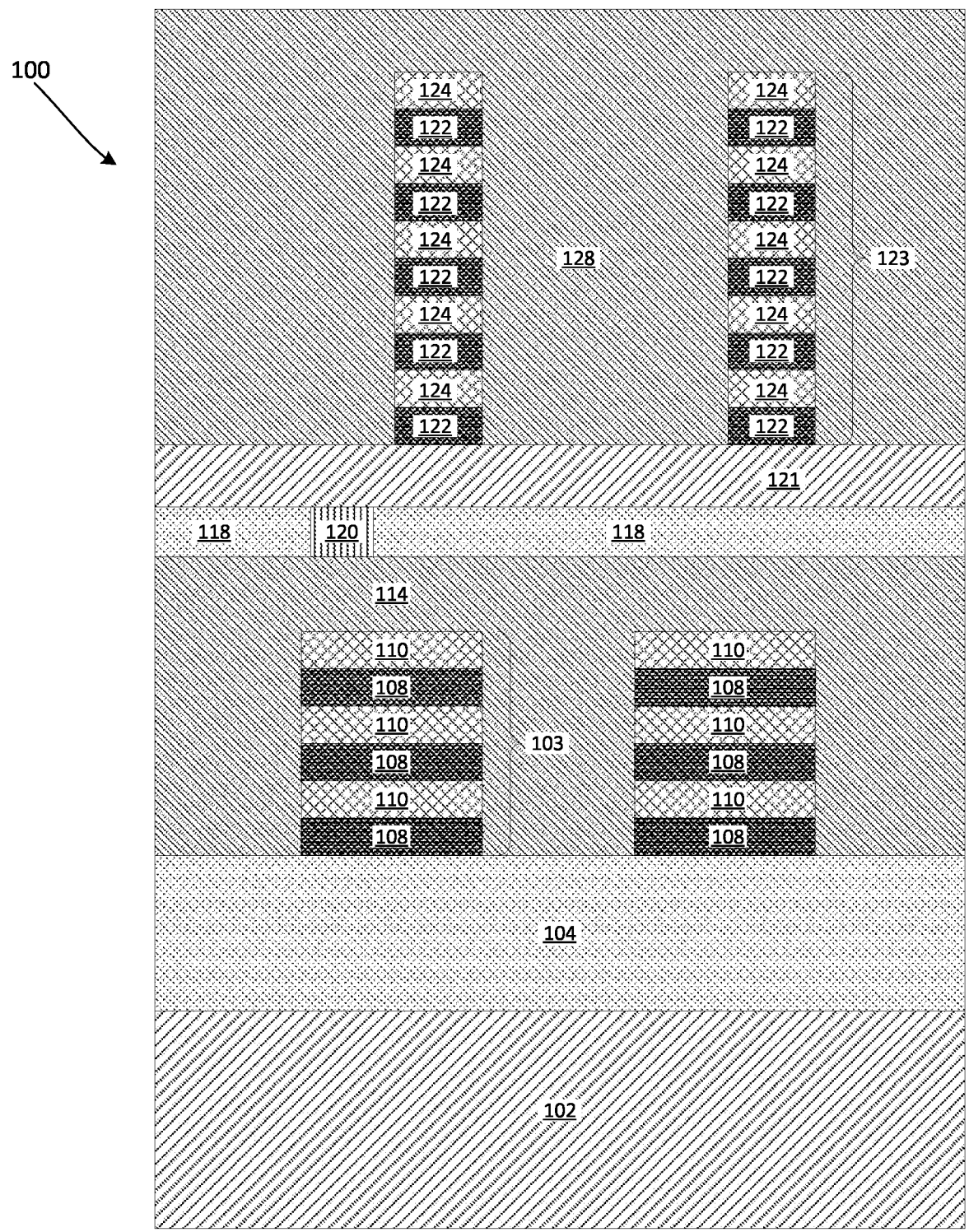
FIG. 4C is a cross-sectional view of the semiconductor device of FIG. 3C after additional fabrication operations and taken along the Y2 line of FIG. 1D, according to embodiments.

FIGS. 4A, 4B, and 4C illustrate the process stage after top active region patterning, dummy gate formation, spacer/inner spacer formation and source/drain epitaxy growth. Referring now to FIG. 4A, this figure depicts a cross-sectional view of the semiconductor device 100 shown in FIG. 3A taken along line X after additional manufacturing operations, according to embodiments. As shown in FIG. 4A, the top channel layers 123 are patterned so that they are not present in the cross-sectional view in FIG. 4A, but they are present in in the cross-sectional view of FIG. 4C (a cross-sectional view of the semiconductor device 100 shown in FIG. 3C taken along line Y2 after additional manufacturing operations). As shown in FIG. 4C, the patterned top channel layers 123 are narrower (less wide) than the nanosheet stack 103. This is also shown in the top down view of FIG. 1D, where the top channel layers 123 (or top active area 230) occupies a smaller footprint than the nanosheet stack 103 (or bottom active area 231). As also shown in FIG. 4A, a top gate 128 is formed over areas generally corresponding to the dummy gates 114. Similarly, as shown in FIG. 4C, the top gate 128 is formed over areas generally corresponding to the dummy gates 114. As also shown in FIG. 4A, a top gate spacer 126 is formed around the top gate 128. The top gate spacer 126 may be formed of the same or different materials as the gate spacer 112 that surrounds the dummy gates 114. A second interlayer dielectric (ILD) layer 130 is formed in the areas between the top gate 128. The material of the second ILD layer 130 may be the same as or different front the material of the first ILD layer 116. As shown in FIG. 4B, a top source/drain epitaxial layer 132 is formed on the oxide bonding layer 121 in areas generally over the epitaxial layer 106. As shown in FIG. 4B, the top source/drain epitaxial layer 132 does not cover up the sacrificial gate contact 120. Similarly, as shown in FIG. 4C, the top channel layers 123 does not cover up the sacrificial gate contact 120. It should be appreciated that these structures shown in FIGS. 4A-4C are formed by any suitable combination of material deposition, patterning and removal processes known to a person of skill in the art.

Figure 5:
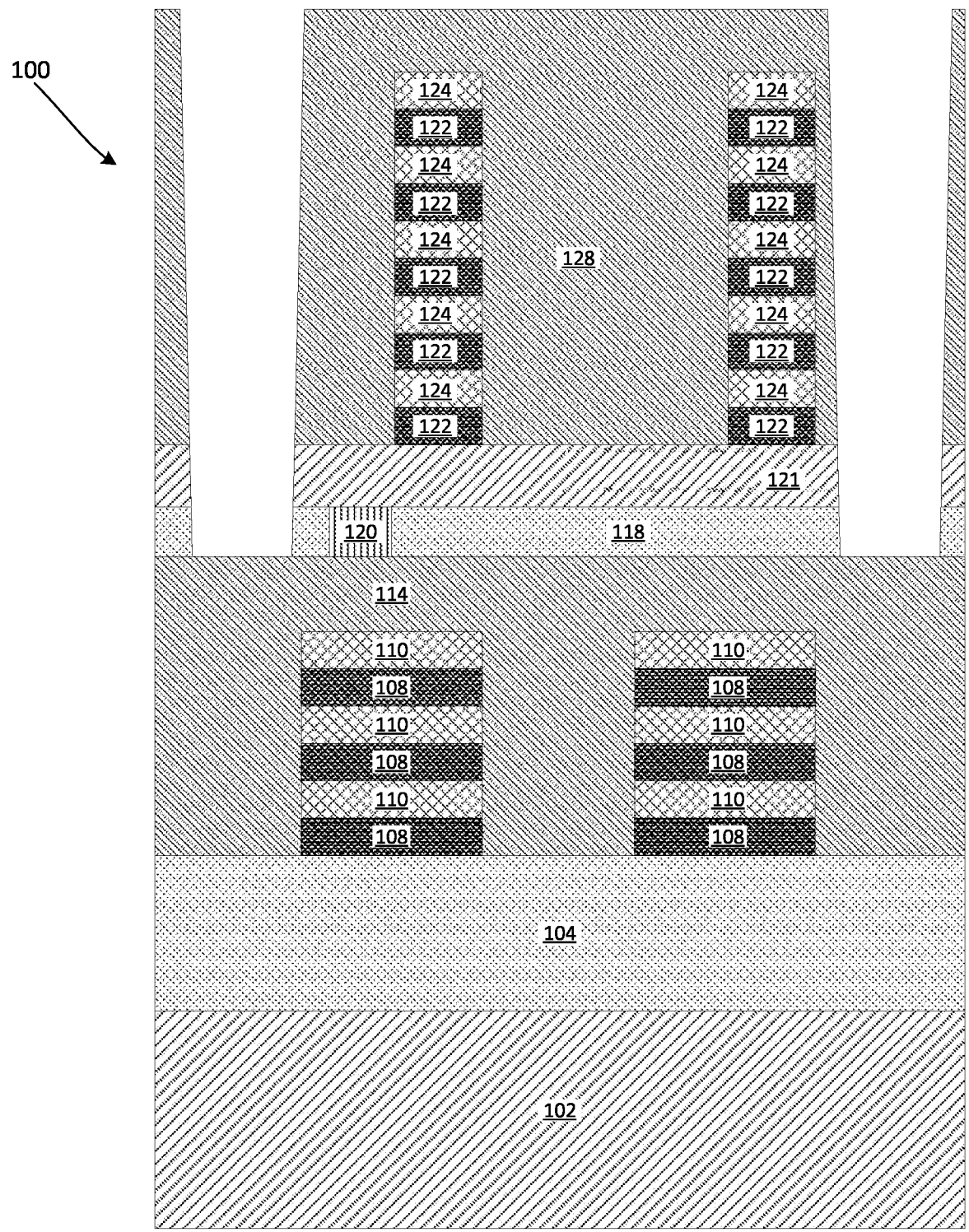
FIG. 5 is a cross-sectional view of the semiconductor device of FIG. 4C after additional fabrication operations and taken along the Y2 line of FIG. 1D, according to embodiments.

Referring now to FIG. 5, this figure depicts a cross-sectional view of the semiconductor device 100 shown in FIG. 4C taken along line Y2 after additional manufacturing operations, according to embodiments. As shown in FIG. 5, a patterning process is performed to created openings through the top gate 128, the bonding oxide layer 121 and the first dielectric layer 118 to expose the dummy gate 114.

Figure 6A:
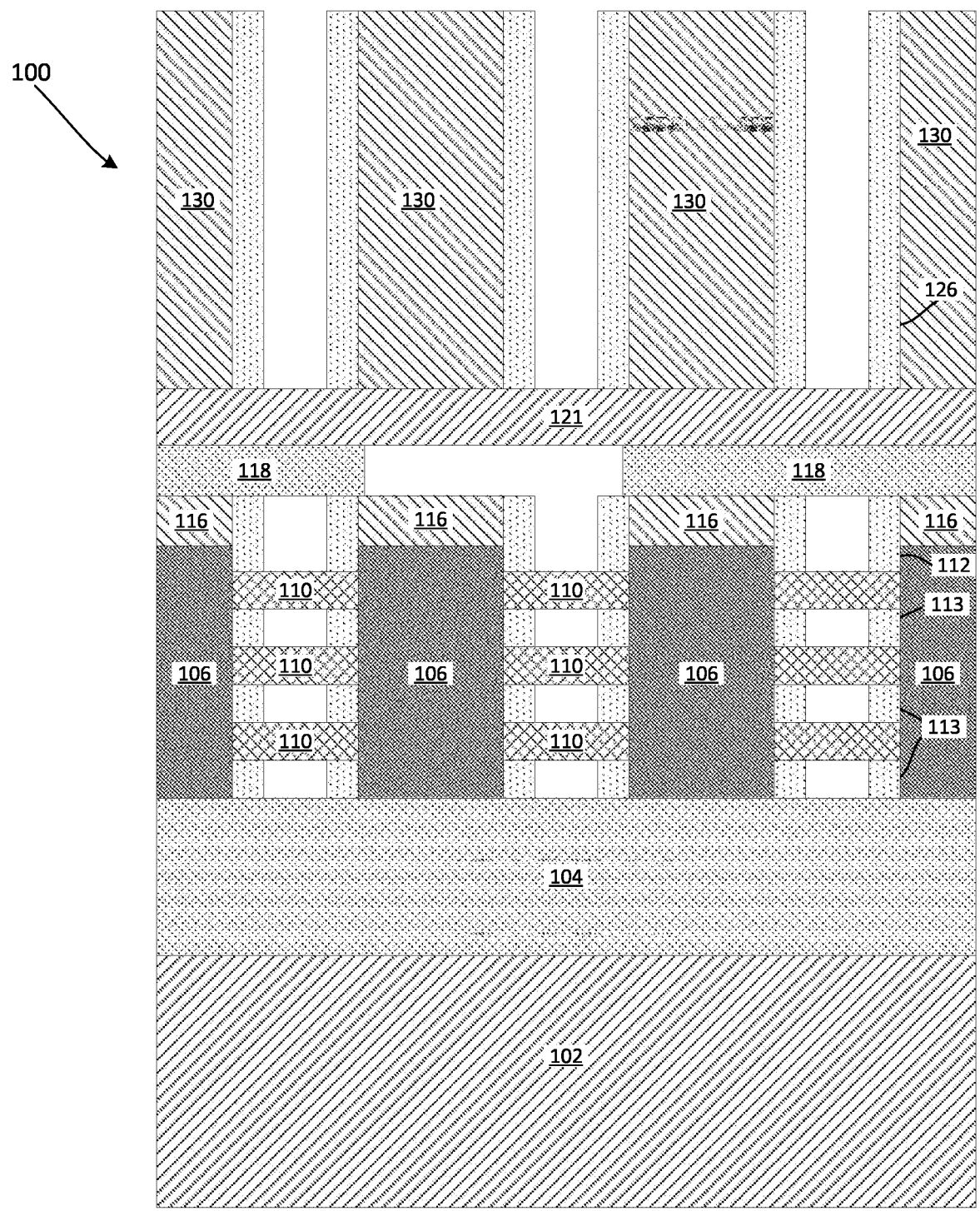
FIG. 6A is a cross-sectional view of the semiconductor device of FIG. 4A after additional fabrication operations and taken along the X line of FIG. 1D, according to embodiments.
Figure 6B:
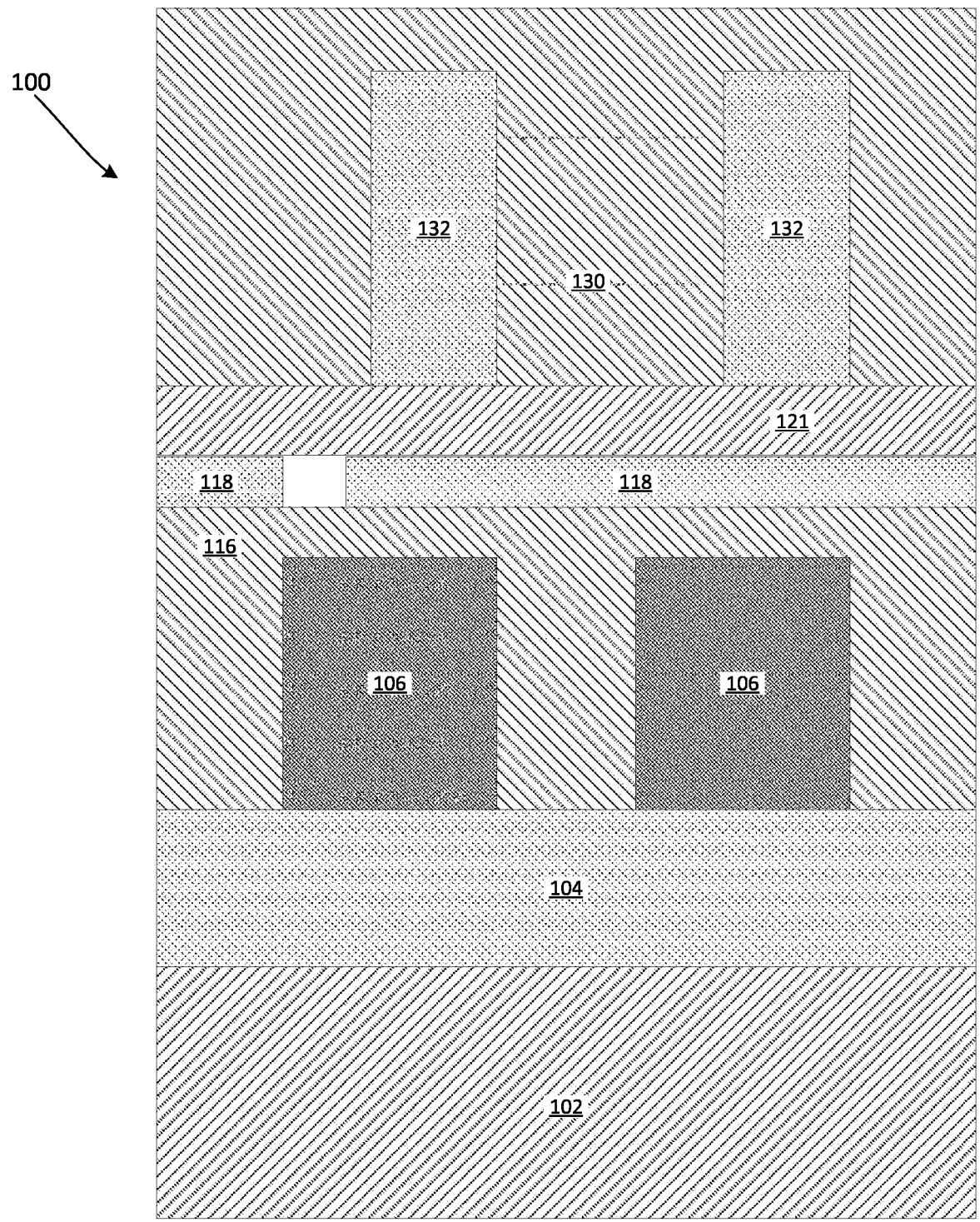
FIG. 6B is a cross-sectional view of the semiconductor device of FIG. 4B after additional fabrication operations and taken along the Y1 line of FIG. 1D, according to embodiments.
Figure 6C:
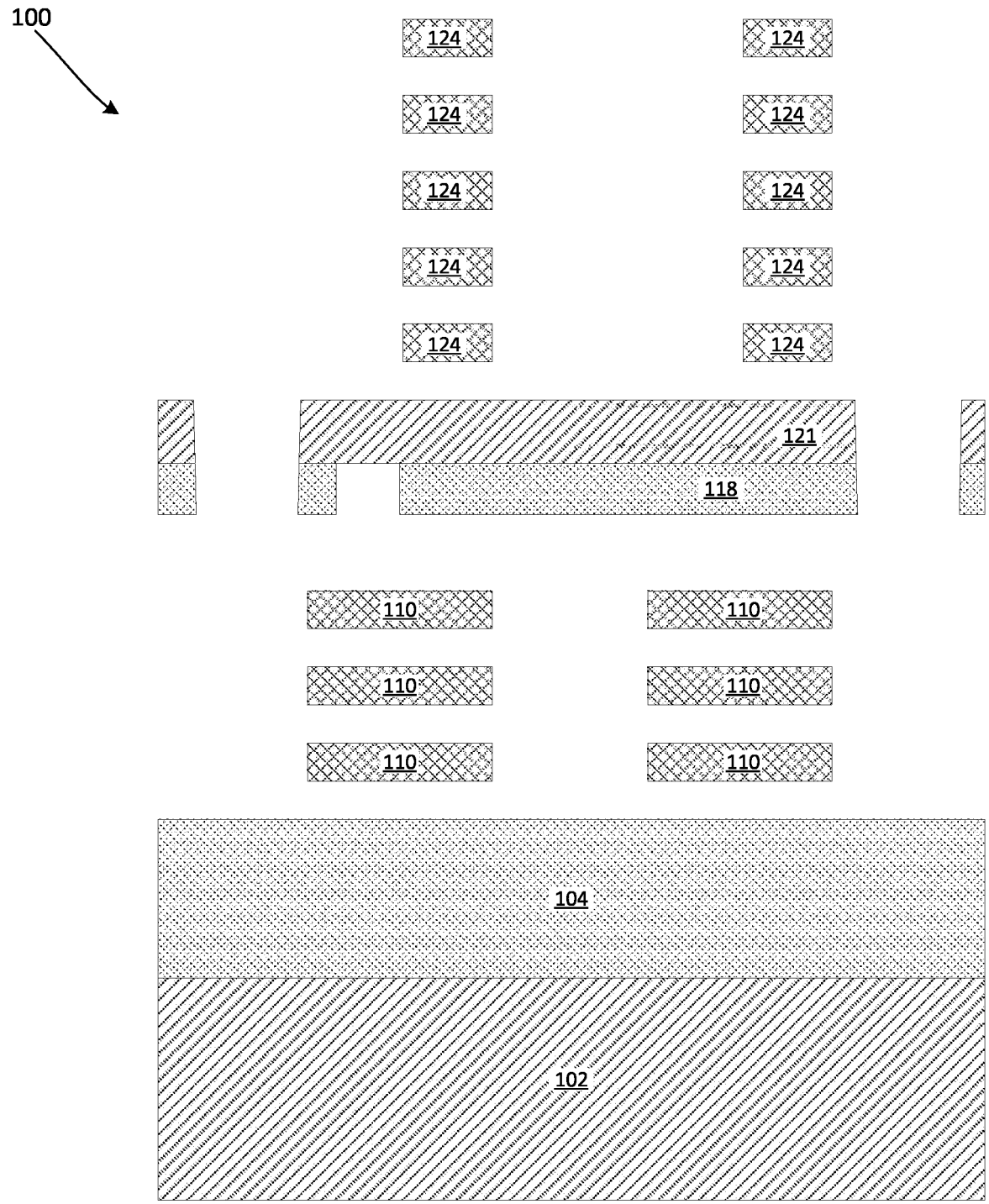
FIG. 6C is a cross-sectional view of the semiconductor device of FIG. 5 after additional fabrication operations and taken along the Y2 line of FIG. 1D, according to embodiments.

FIGS. 6A, 6B and 6C illustrate a process stage where top and bottom dummy gates, sacrificial layers, and sacrificial gate contacts are selectively removed. Referring now to FIGS. 6A, this figure depicts a cross-sectional view of the semiconductor device 100 shown in FIG. 4A taken along line X after additional manufacturing operations, according to embodiments. As shown in FIGS. 6A, 6B (a cross-sectional view of the semiconductor device 100 shown in FIG. 4B taken along line Y1 after additional manufacturing operations) and 6C (a cross-sectional view of the semiconductor device 100 shown in FIG. 5 taken along line Y2 after additional manufacturing operations), the dummy gate 114, the top gate 128, the sacrificial layers 108, the top sacrificial layers 122, and the sacrificial gate contact 120 are removed. These layers may be removed with one or more material removal processes.

Figure 7A:
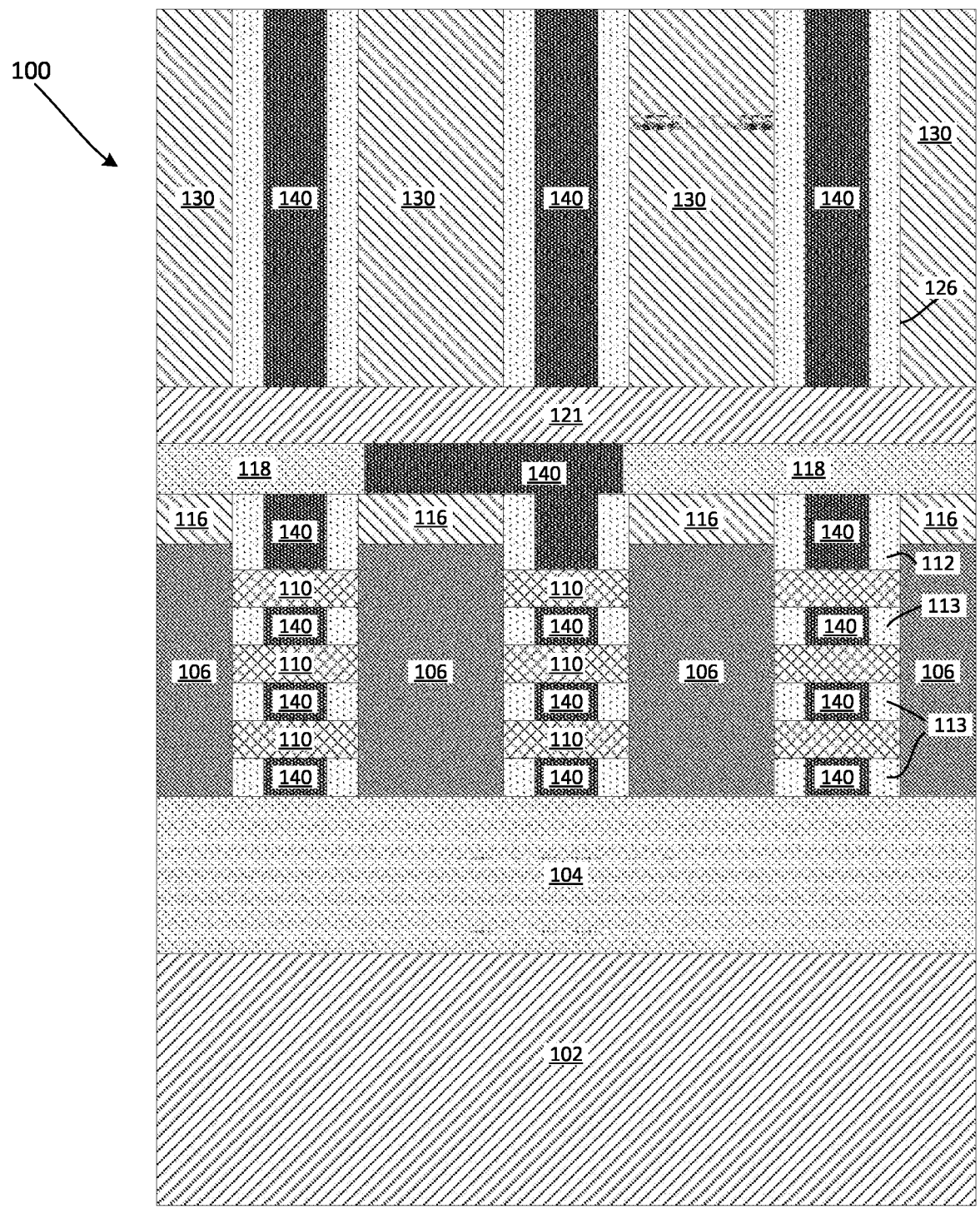
FIG. 7A is a cross-sectional view of the semiconductor device of FIG. 6A after additional fabrication operations and taken along the X line of FIG. 1D, according to embodiments.
Figure 7B:
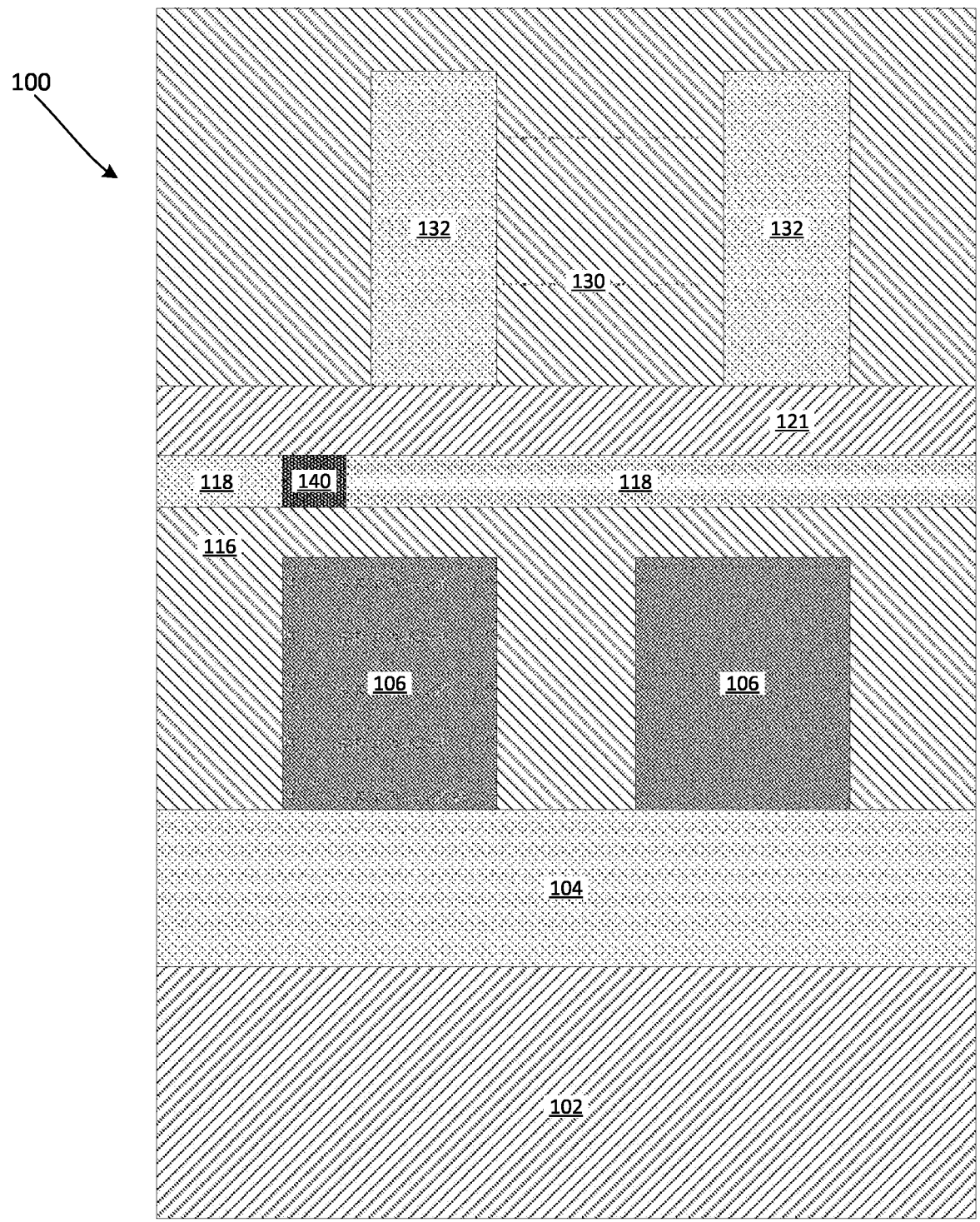
FIG. 7B is a cross-sectional view of the semiconductor device of FIG. 6B after additional fabrication operations and taken along the Y1 line of FIG. 1D, according to embodiments.
Figure 7C:
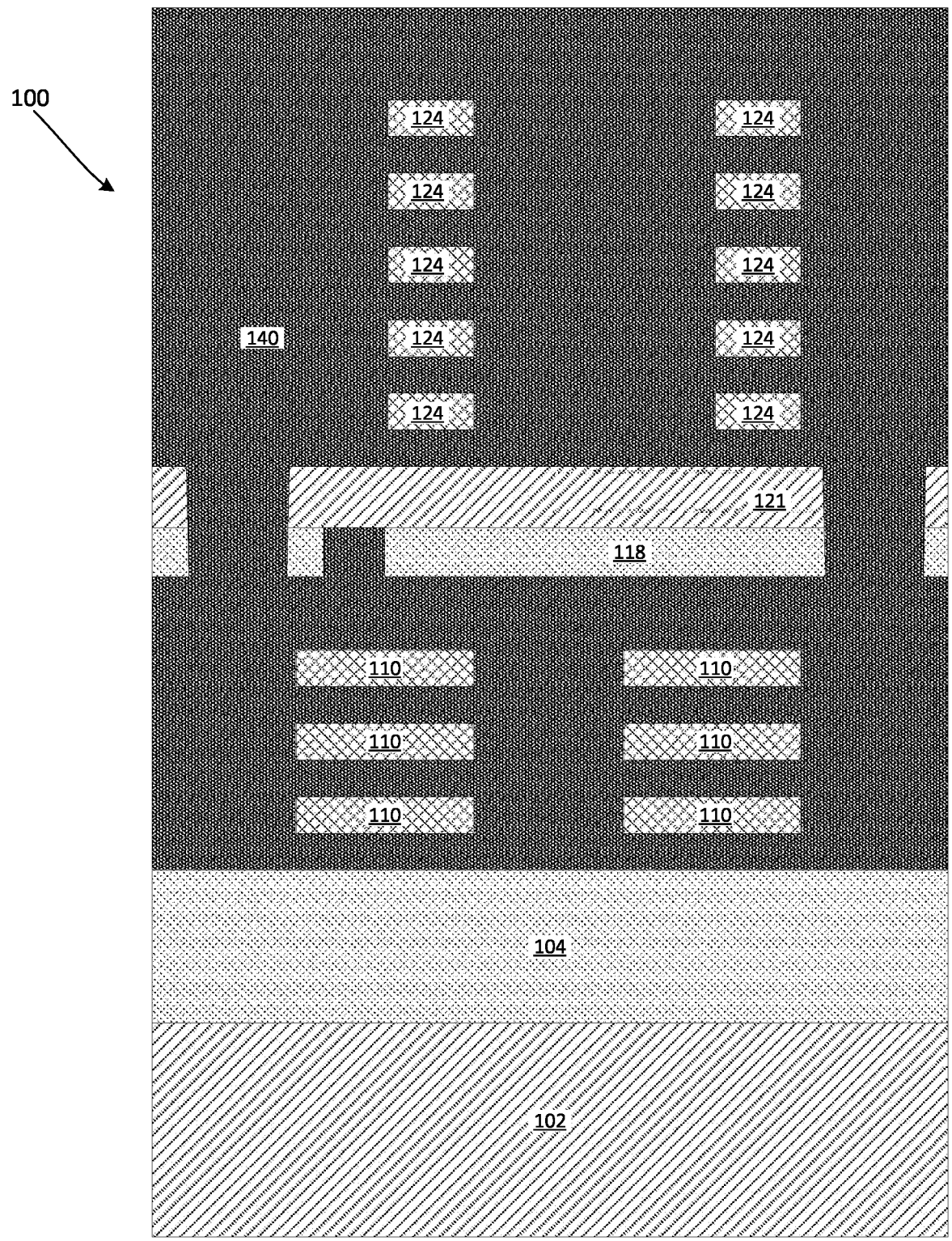
FIG. 7C is a cross-sectional view of the semiconductor device of FIG. 6C after additional fabrication operations and taken along the Y2 line of FIG. 1D, according to embodiments.

FIGS. 7A, 7B and 7C illustrate the process stage after formation of replacement gate. Referring now to FIG. 7A, this figure depicts a cross-sectional view of the semiconductor device 100 shown in FIG. 6A taken along line X after additional manufacturing operations, according to embodiments. As shown in FIGS. 7A, 7B (a cross-sectional view of the semiconductor device 100 shown in FIG. 6B taken along line Y1 after additional manufacturing operations) and 7C (a cross-sectional view of the semiconductor device 100 shown in FIG. 6C taken along line Y2 after additional manufacturing operations), a high-κ metal gate (HKMG) 140 is formed to fill in all the areas created by the material removal processes described above with respect to FIGS. 6A-6C (i.e., the spaces created by the removal of the dummy gate 114, the top gate 128, the sacrificial layers 108, the top sacrificial layers 122, and the sacrificial gate contact 120).

Figure 8A:
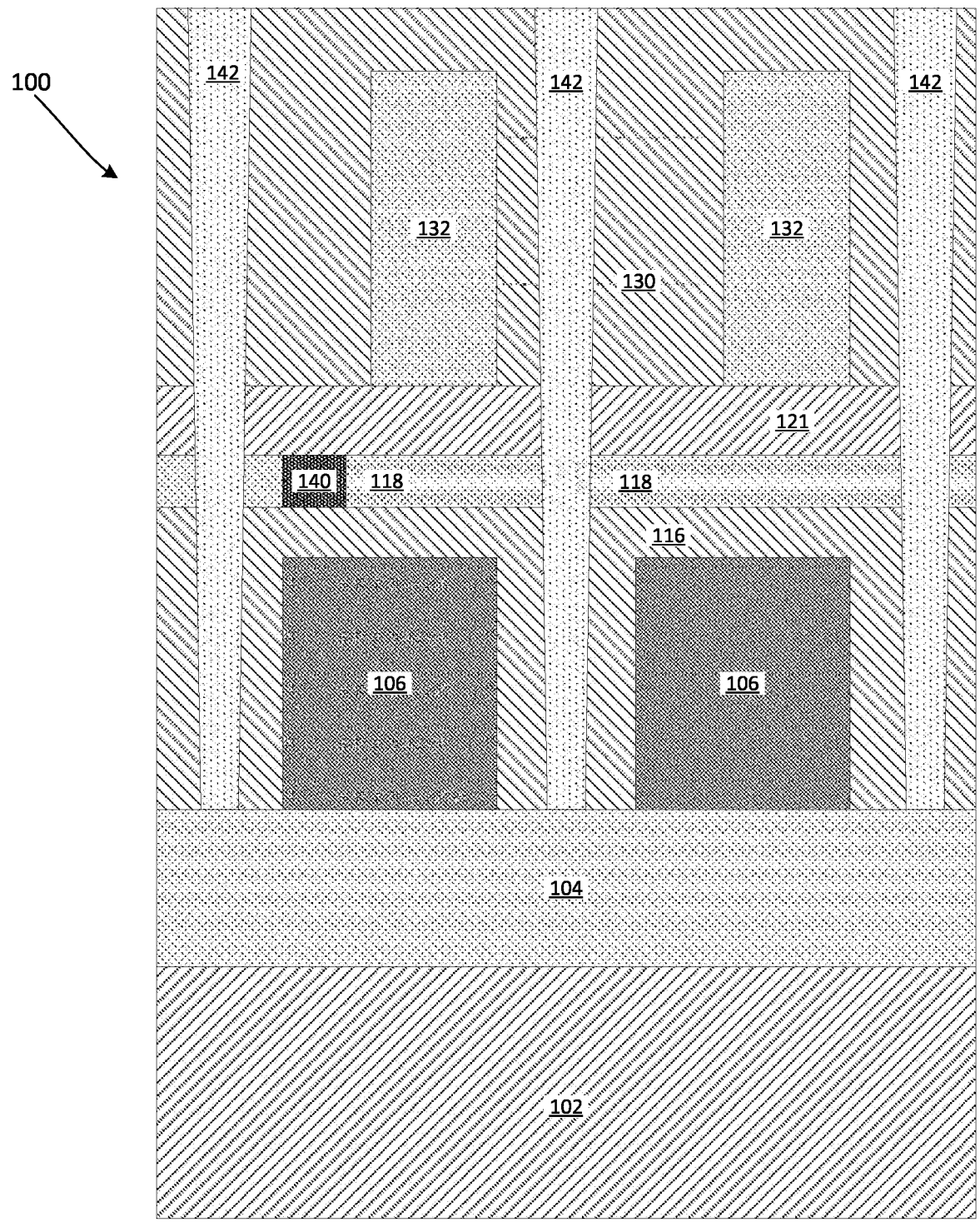
FIG. 8A is a cross-sectional view of the semiconductor device of FIG. 7B after additional fabrication operations and taken along the X line of FIG. 1D, according to embodiments.
Figure 8B:
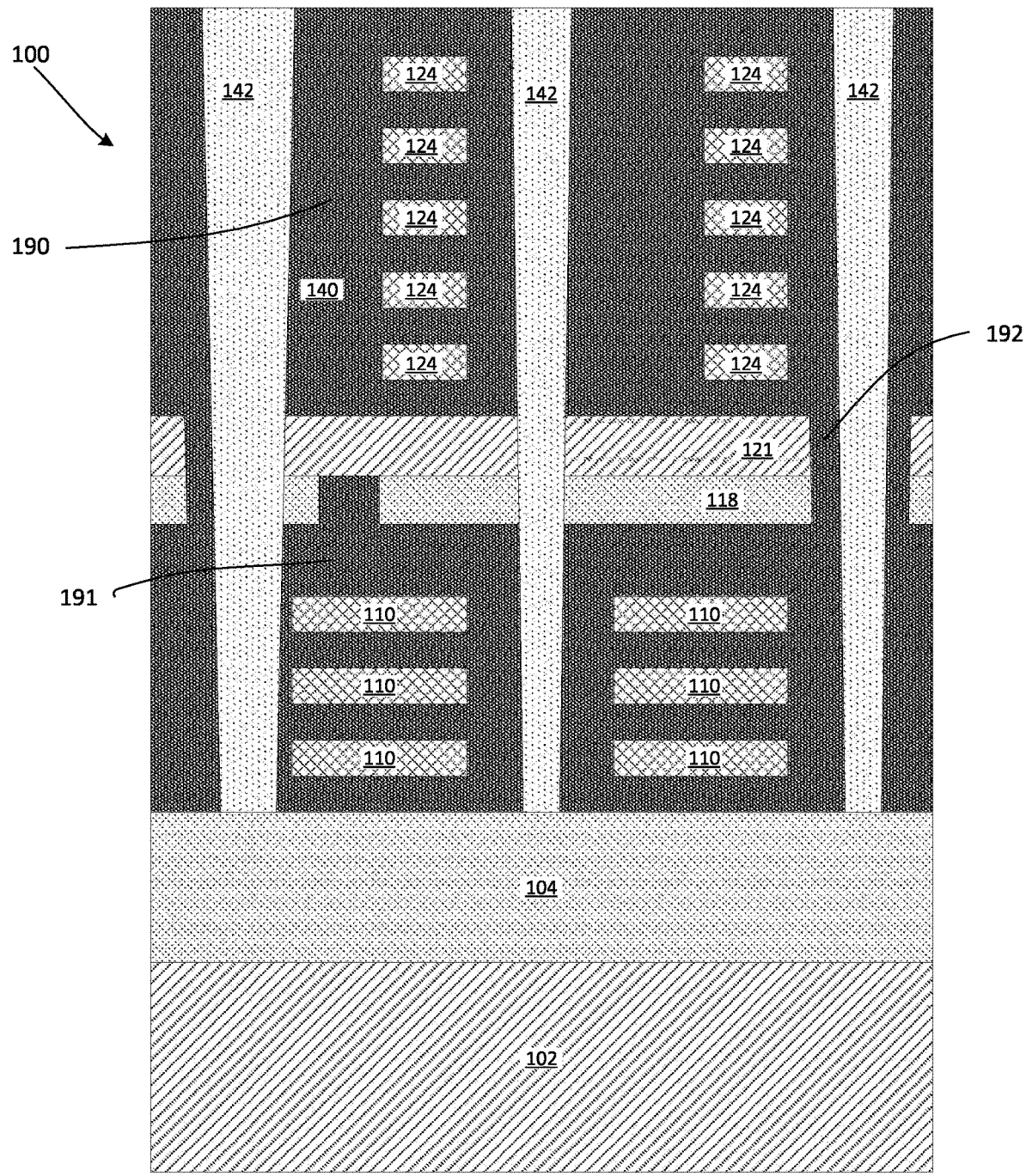
FIG. 8B is a cross-sectional view of the semiconductor device of FIG. 7C after additional fabrication operations and taken along the Y1 line of FIG. 1D, according to embodiments.

FIGS. 8A and 8B illustrate a process stage after gate cut formation. Referring now to FIG. 8A, this figure depicts a cross-sectional view of the semiconductor device 100 shown in FIG. 7B taken along line Y1 after additional manufacturing operations, according to embodiments. As shown in FIG. 8A, late gate cut (or gate cut) is patterned in the semiconductor device 100 through the second ILD layer 130, the bonding oxide layer 121, the first dielectric layer 118 and the ILD layer 116 down to the level where the BOX layer 104 is exposed. Then, this area that is removed is filled with the late gate cut insulating layer 142. As shown in the views of FIGS. 8A and 8B (a cross-sectional view of the semiconductor device 100 shown in FIG. 7C taken along line Y2 after additional manufacturing operations), this late gate cut insulating layer 142 is formed in three locations in these particular cross-sectional views. As shown in FIG. 8B, a first gate 190 is independent from a second gate 191 because the gate cut insulating layer 142 on the left side contacts the oxide bonding layer 121 and the first dielectric layer 118. However, a third gate 192 is a shared gate because the gate cut insulating layer 142 on the right side does not contact the oxide bonding layer 121 or the first dielectric layer 118

Figure 9A:
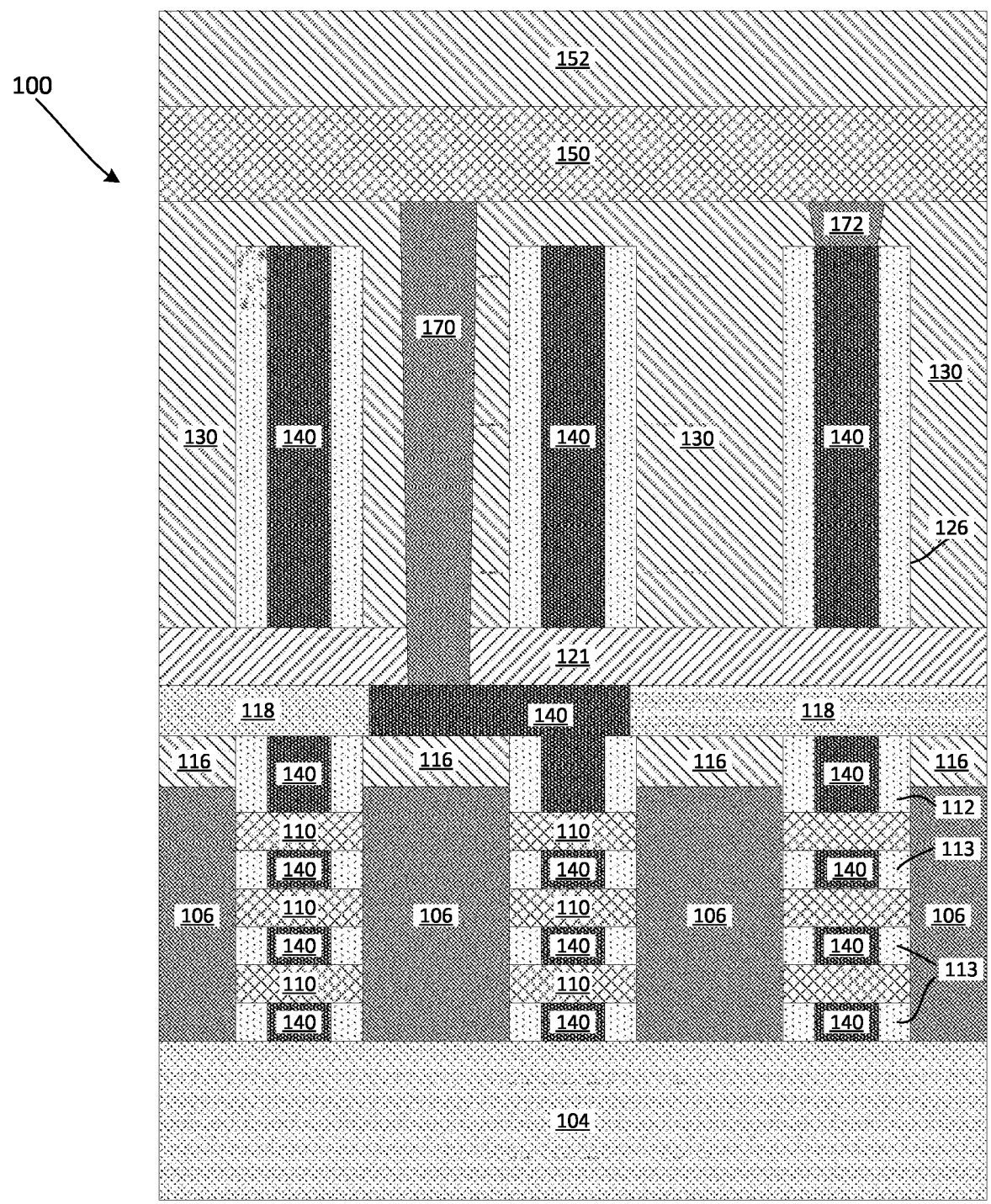
FIG. 9A is a cross-sectional view of the semiconductor device of FIG. 7A after additional fabrication operations and taken along the X line of FIG. 1D, according to embodiments.
Figure 9B:
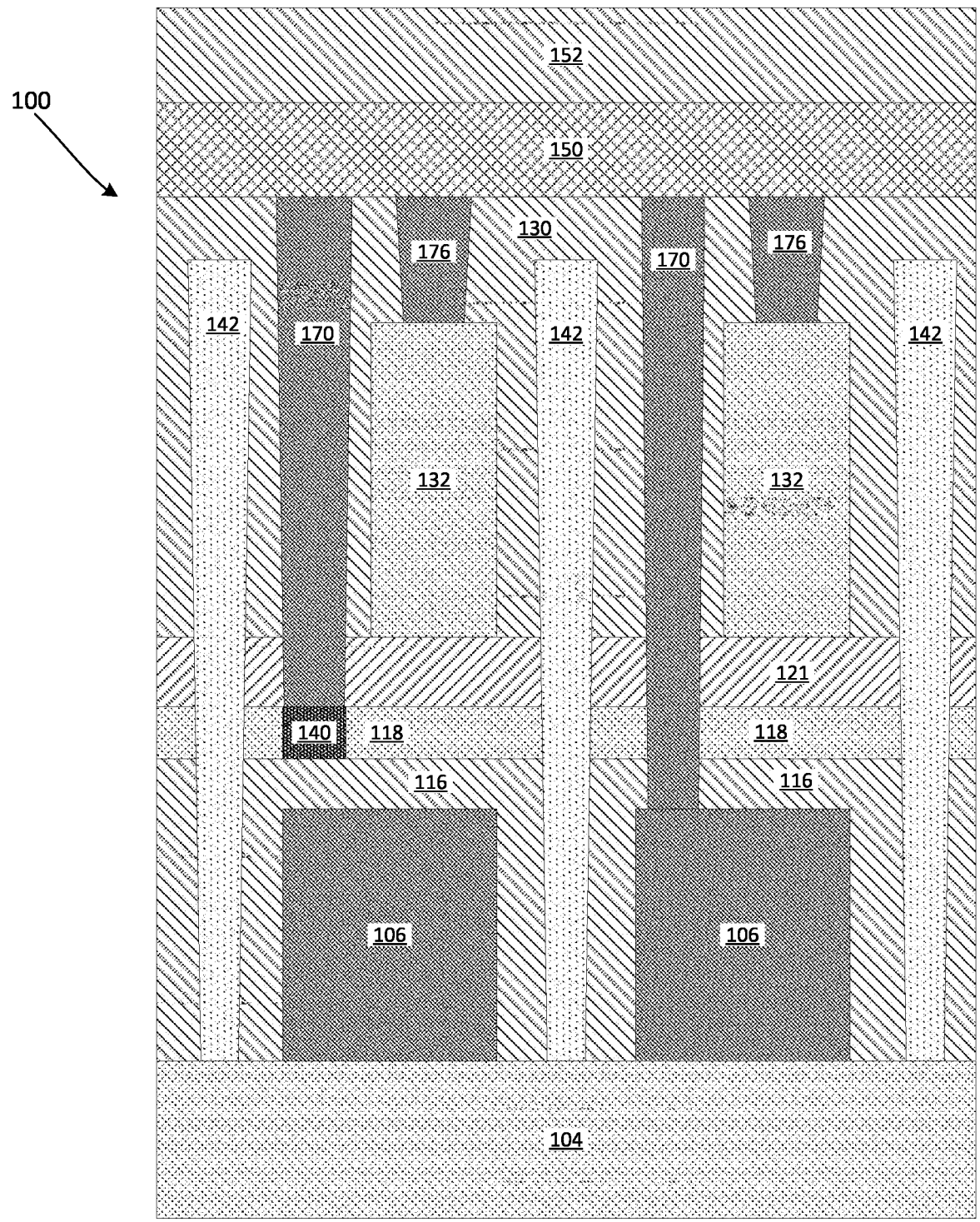
FIG. 9B is a cross-sectional view of the semiconductor device of FIG. 8B after additional fabrication operations and taken along the Y1 line of FIG. 1D, according to embodiments.
Figure 9C:
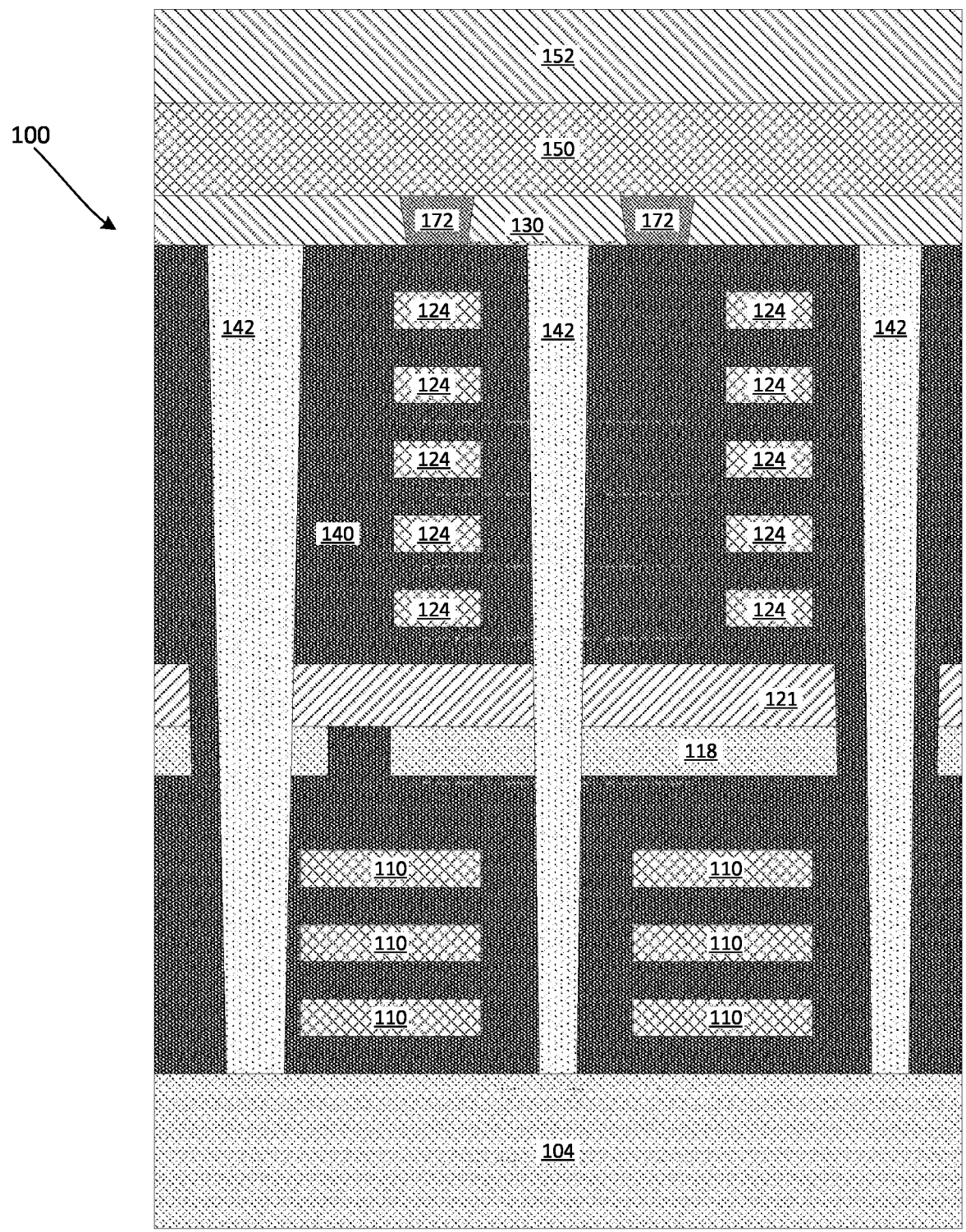
FIG. 9C is a cross-sectional view of the semiconductor device of FIG. 8C after additional fabrication operations and taken along the Y2 line of FIG. 1D, according to embodiments.

FIGS. 9A, 9B and 9C illustrate the process stage after formation of MOL contacts, BEOL interconnects, carrier wafer bonding, wafer flip, and substrate removal. Referring now to FIG. 9A, this figure depicts a cross-sectional view of the semiconductor device 100 shown in FIG. 7A taken along line X after additional manufacturing operations, according to embodiments. As shown in FIG. 9A, a first front-side contact 170 is formed between the leftmost and middle HKMG 140 layers. The first front-side contact 170 may be formed by first etching a via through the second ILD layer 130 and the oxide bonding layer 121 to expose the HKMG 140 on the portion that was previously the sacrificial gate contact 120 (as shown in FIG. 4A). Then any suitable metal material may be used to fill in the via and form the front-side contact 170.

As shown in cross-sectional view of FIG. 9B, the first front-side contact 170 is formed in two different locations. One of the first front-side contacts 170 (i.e., the left one) is shown in FIG. 9B to be formed to connect with the HKMG 140. Another one of the first front-side contacts 170 (i.e., the right one) is shown in FIG. 9B to contact with the bottom source/drain epitaxial layer 106 on the right side of FIG. 9B. To form the first front-side contact 170 on the right side, a via is etched through the second ILD layer 130, the oxide bonding layer 121, the first dielectric layer 118, and the ILD layer 116 to expose the bottom source/drain epitaxial layer 106 on the right side. Then, as mentioned above, any suitable metal material may be used to fill in the via and form the front-side contact 17.

As also shown in FIGS. 9A and 9C (a cross-sectional view of the semiconductor device 100 shown in FIG. 8B taken along line Y2 after additional manufacturing operations), second front-side contacts 172 are also formed over the HKMG 140 layer. It should be appreciated that these second front-side contacts 172 may be formed in a similar manner and may comprise the same of different materials as the first front-side contacts 170. As shown in FIG. 9B, third front-side contacts 176 are formed over the top source/drain epitaxial layers 132. It should be appreciated that these third front-side contacts 176 may be formed in a similar manner and may comprise the same of different materials as the first front-side contacts 170 or the second front-side contacts 172.

As also shown in FIGS. 9A-9C, a back-end-of-line (BEOL) interconnect layer 150 is formed over the first front-side contacts 170, the second front-side contacts 172 and the third front-side contacts 176. In general, The BEOL is the second portion of IC fabrication where the individual devices (transistors, capacitors, resistors, etc.) get interconnected with wiring on the wafer, the metallization layer. Then, a carrier wafer 152 is attached to the BEOL layer 150 using conventional wafer bonding process. As also shown in FIGS. 9A-9C, the wafer is then flipped, the substrate 102 is removed, stopping on the buried oxide layer 104.

Figure 10A:
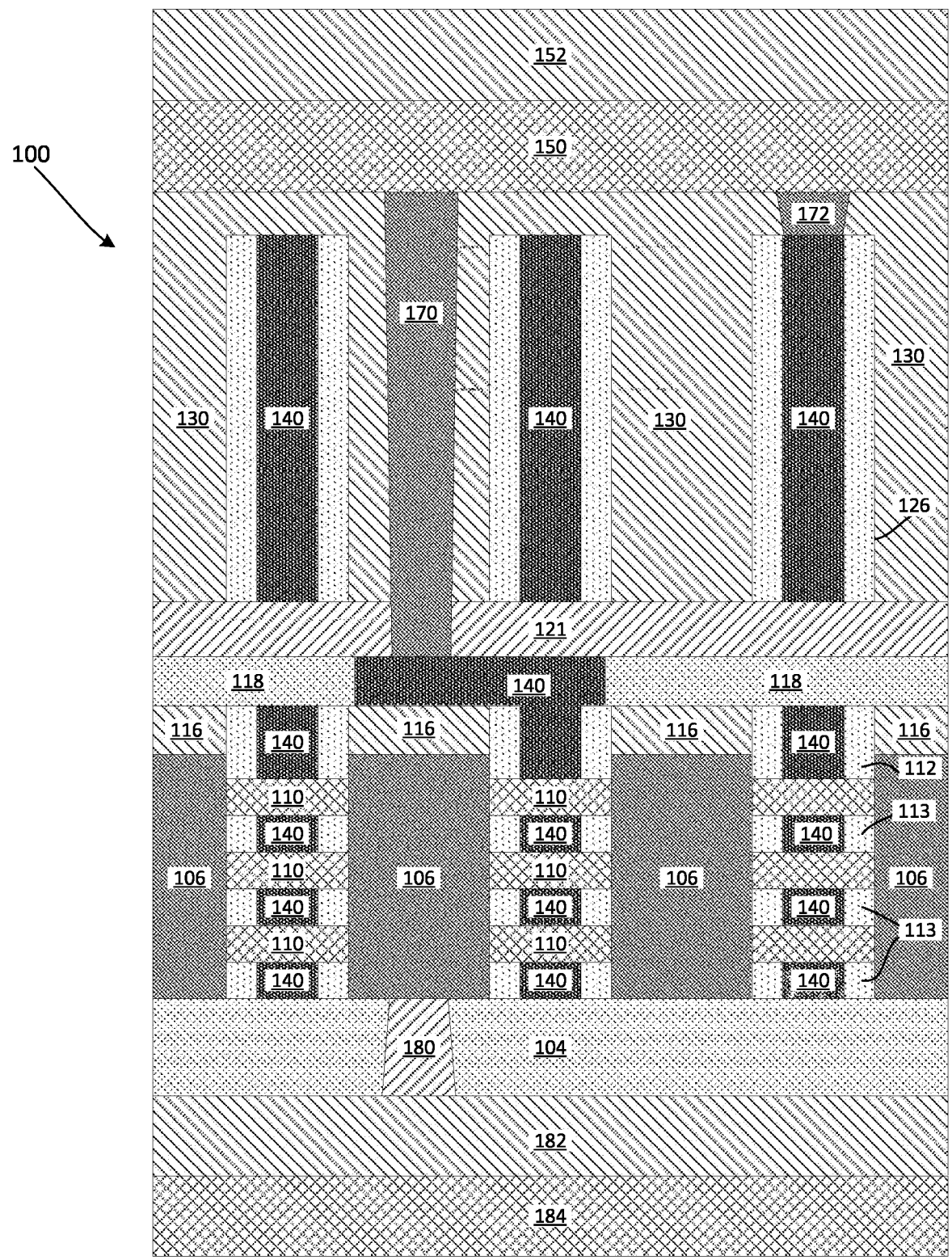
FIG. 10A is a cross-sectional view of the semiconductor device of FIG. 9A after additional fabrication operations and taken along the X line of FIG. 1D, according to embodiments.
Figure 10B:
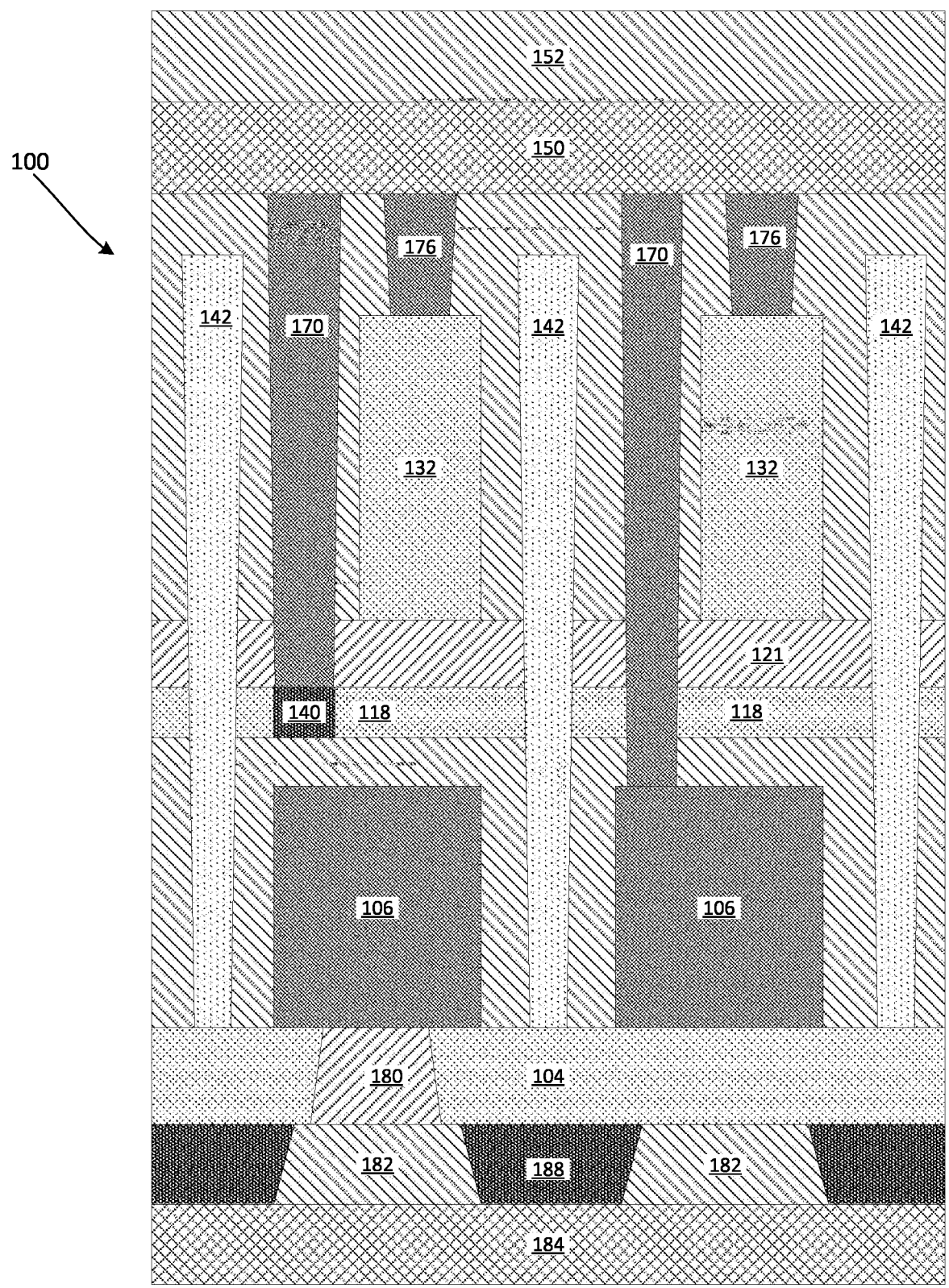
FIG. 10B is a cross-sectional view of the semiconductor device of FIG. 9B after additional fabrication operations and taken along the Y1 line of FIG. 1D, according to embodiments.
Figure 10C:
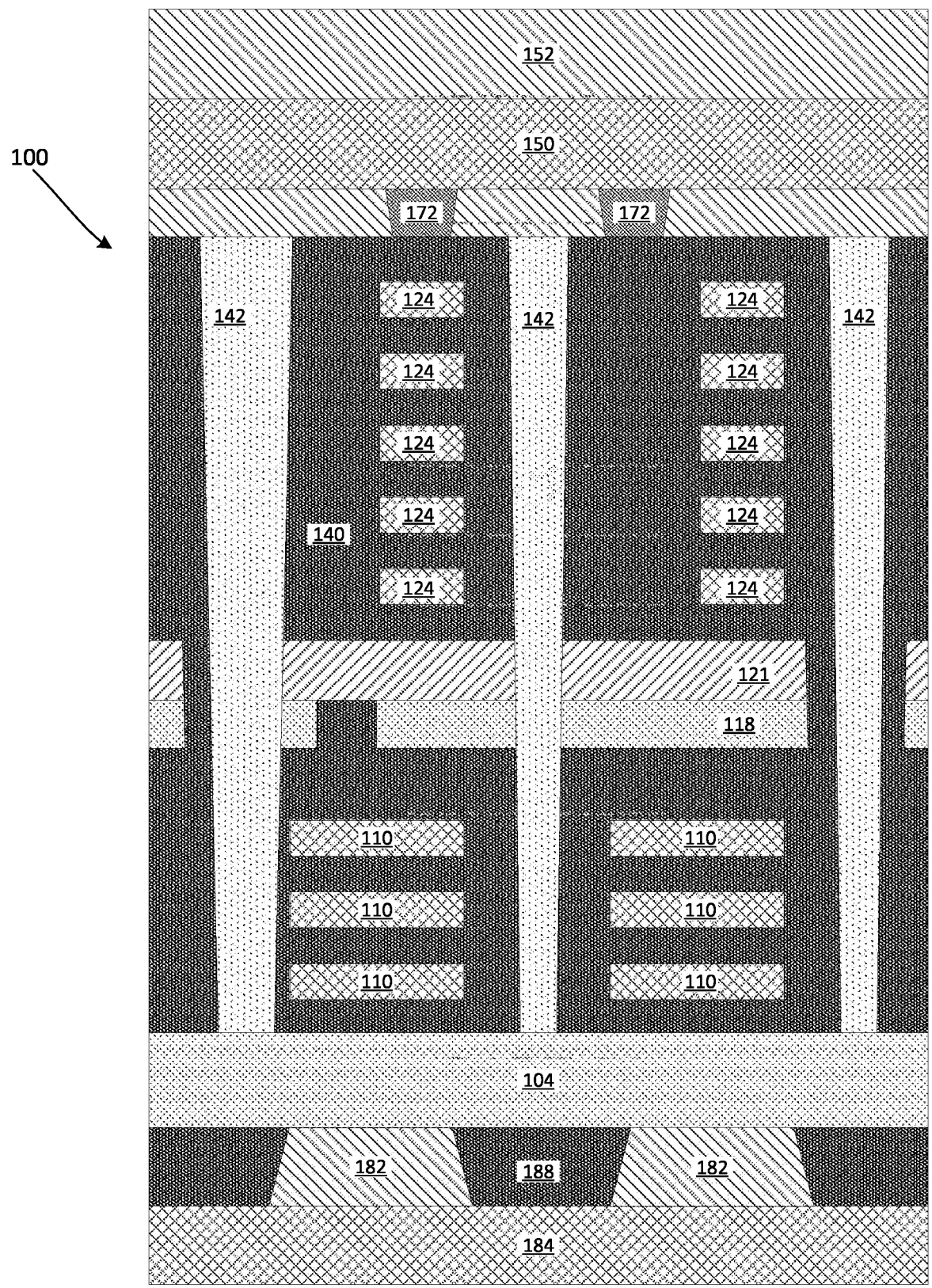
FIG. 10C is a cross-sectional view of the semiconductor device of FIG. 9C after additional fabrication operations and taken along the Y2 line of FIG. 1D, according to embodiments.

FIGS. 10A, 10B and 10C illustrate a process stage after formation of backside contact and backside interconnects (sometimes backside interconnects comprise backside power rails and backside power distribution networks). Referring now to FIG. 10A, this figure depicts a cross-sectional view of the semiconductor device 100 shown in FIG. 9A taken along line X after additional manufacturing operations, according to embodiments. As shown in FIGS. 10A and 10B (a cross-sectional view of the semiconductor device 100 shown in FIG. 9B taken along line Y1 after additional manufacturing operations), a backside contact is formed through the BOX layer to connect to the bottom source/drain epitaxial layer 106. Also, a backside dielectric layer 188 is formed on the BOX layer 104. As shown in FIG. 10A, 10B, 10C, a backside power rail 182 is formed at the in the backside dielectric layer 188. As shown in FIG. 10B, a left portion of the backside power rail 182 connects to the backside contact 180. As shown in FIGS. 10A, 10B and 10C (a cross-sectional view of the semiconductor device 100 shown in FIG. 9C taken along line Y2 after additional manufacturing operations), a backside power distribution network is formed on the back side power rail 182 and backside dielectric layer 188.

Figure 11A:
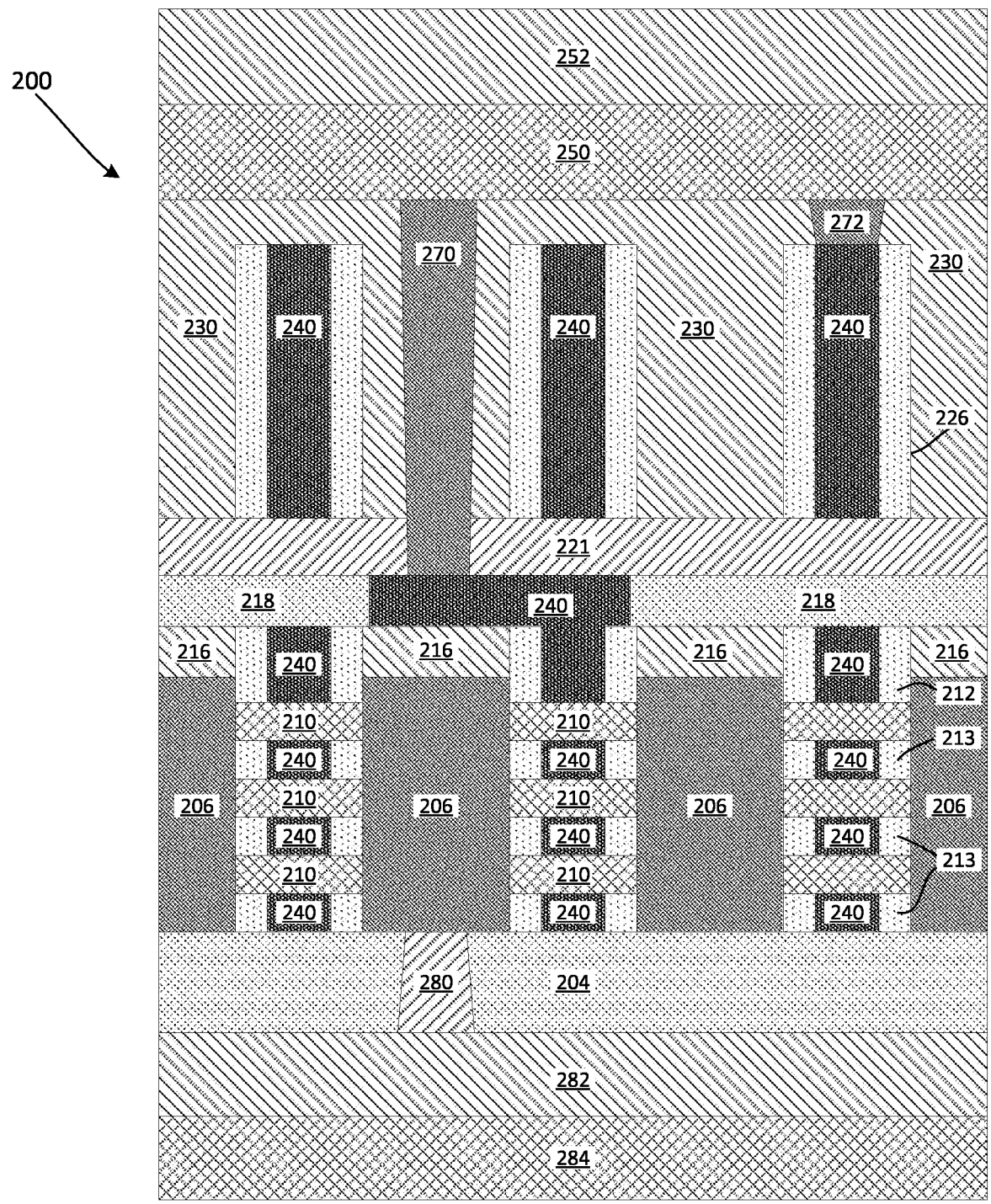
FIG. 11A is a cross-sectional view of a semiconductor device at an intermediate stage of the fabrication process and taken along the X line of FIG. 1D, according to embodiments.
Figure 11B:
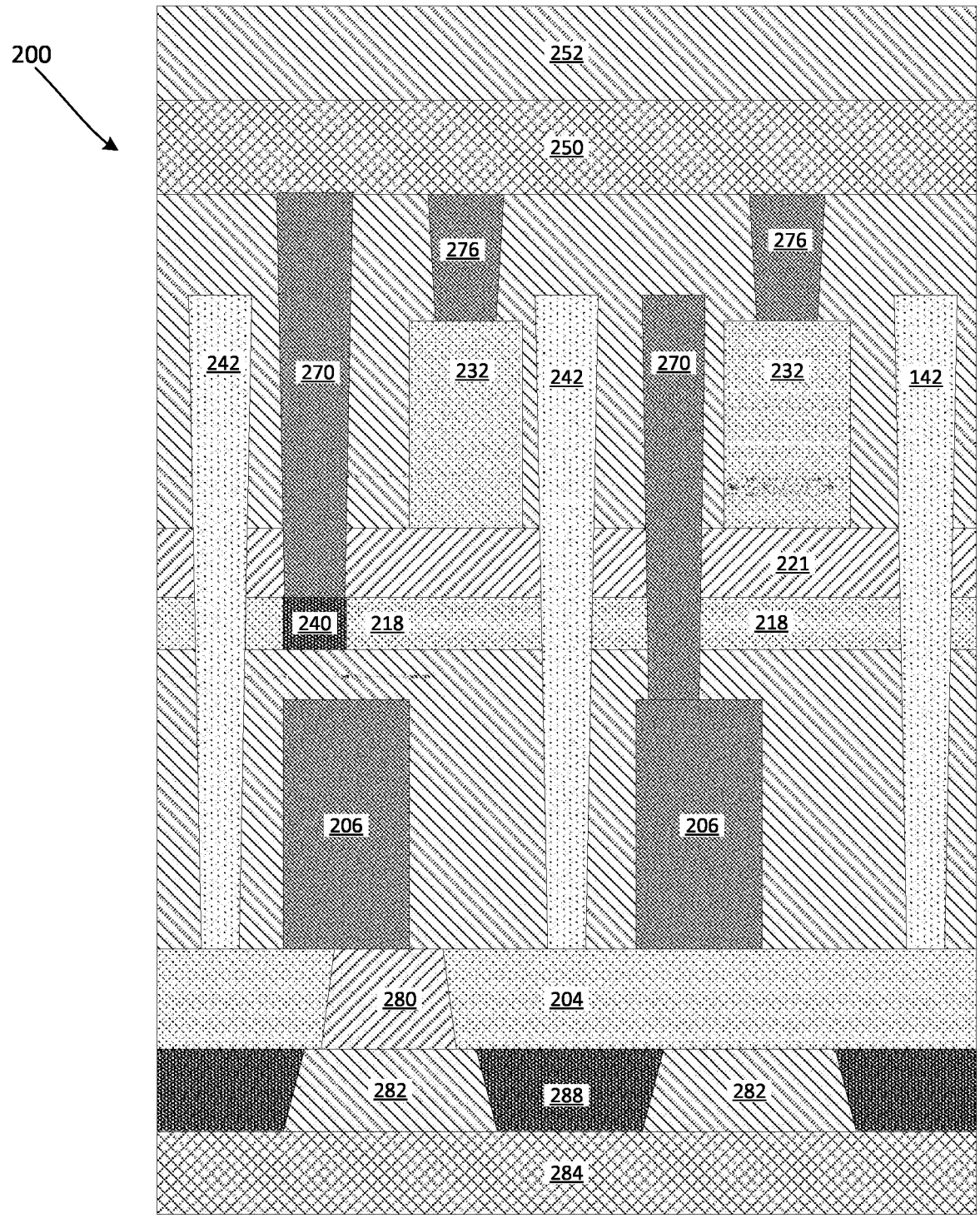
FIG. 11B is a cross-sectional view of the semiconductor device at an intermediate stage of the fabrication process and taken along the Y1 line of FIG. 1D, according to embodiments.
Figure 11C:
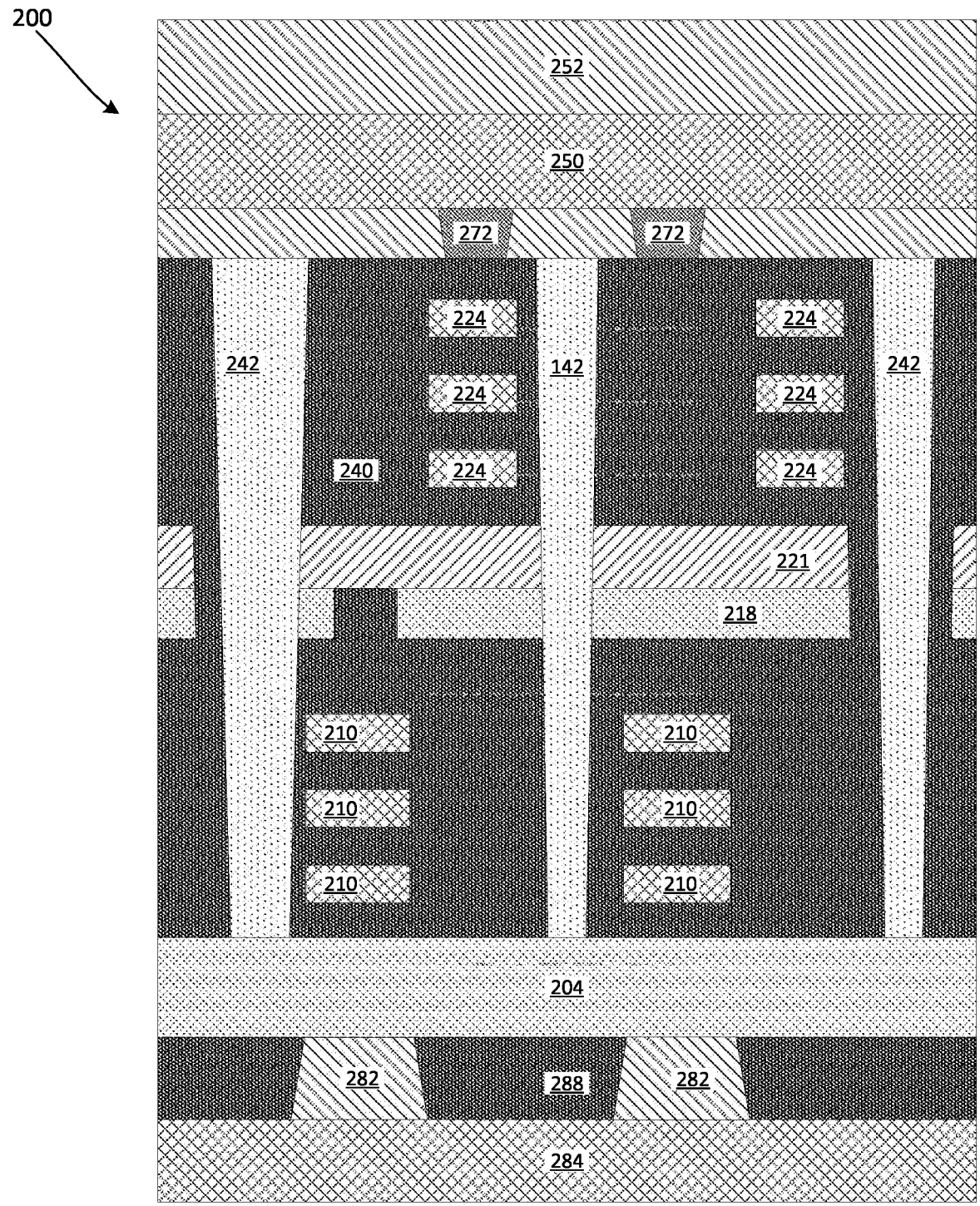
FIG. 11C is a cross-sectional view of the semiconductor device at an intermediate stage of the fabrication process and taken along the Y2 line of FIG. 1D, according to embodiments.

FIGS. 11A, 11B and 11C illustrate an alternative embodiment that bottom/top active regions have a staggered configuration. Referring now to FIG. 11A, this figure depicts a cross-sectional view of another embodiment of a semiconductor device 200 taken along line X at the same stage of the manufacturing operation as FIG. 10A, according to embodiments. Applicant notes that the reference numerals and structural components are analogous to the reference numerals in the first embodiments, and the description of same is omitted for the sake of simplicity. As shown in FIG. 11C, this embodiment is different in that the FETs have a staggered configuration. In particular, the active semiconductor layers 210 are narrower than the active semiconductor layers 110 in the first embodiment so that they are offset to the left of the corresponding top active semiconductor layers 224. In other respects, the structure and the method of manufacturing the semiconductor device 200 is similar to that of the semiconductor device 100.

The descriptions of the various embodiments have been presented for purposes of illustration and are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor device comprising:
   a bottom field effect transistor (FET) including a bottom source-drain epitaxial layer formed on sides of the bottom FET;
   a top FET stacked over the bottom FET;
   a back-end-of-line (BEOL) layer formed on the top FET;
   a bottom gate contact formed in contact with the bottom FET and having an extending portion of the bottom gate contact that extends laterally over the bottom source-drain epitaxial layer; and
   a top gate contact formed in contact with the extending portion of the bottom gate contact and electrically connecting the bottom gate contact to the BEOL layer.

2. The semiconductor device according to claim 1, wherein the bottom FET includes alternating layers of active semiconductor layers and high-κ metal gate layers.

3. The semiconductor device according to claim 2, further comprising a gate spacer surrounding the high-κ metal gate layers.

4. The semiconductor device according to claim 1, further comprising a late gate cut insulating layer extending from the top FET to the bottom FET.

5. The semiconductor device according to claim 4, wherein the late gate cut insulating layer electrically isolates the top FET and the bottom FET.

6. The semiconductor device according to claim 1, wherein the bottom gate contact is formed of a high-κ material.

7. The semiconductor device according to claim 1, wherein the top gate contact is laterally offset from the top FET and the bottom FET.

8. The semiconductor device according to claim 1, further comprising a first bonding oxide layer formed at a same level as the bottom gate contact.

9. The semiconductor device according to claim 1, wherein an active region of the top FET is smaller than an active region of the bottom FET.

10. The semiconductor device according to claim 1, wherein an active region of the top FET is laterally offset from an active region of the bottom FET.

11. A method of manufacturing a semiconductor device, the method comprising:
    forming a bottom field effect transistor (FET) including a bottom source-drain epitaxial layer on sides of the bottom FET;
    forming a top FET stacked over the bottom FET;
    forming a back-end-of-line (BEOL) layer on the top FET;
    forming a bottom gate contact in contact with the bottom FET and having an extending portion of the bottom gate contact that extends laterally over the bottom source-drain epitaxial layer; and
    forming a top gate contact in contact with the extending portion of the bottom gate contact and electrically connecting the bottom gate contact to the BEOL layer.

12. The method of manufacturing the semiconductor device of claim 11, wherein the bottom FET includes alternating layers of active semiconductor layers and high-κ metal gate layers.

13. The method of manufacturing the semiconductor device according to claim 12, further comprising forming a gate spacer surrounding the high-κ metal gate layers.

14. The method of manufacturing semiconductor device of claim 11, further comprising forming a late gate cut insulating layer extending from the top FET to the bottom FET.

15. The method of manufacturing the semiconductor device of claim 14, wherein the late gate cut insulating layer electrically isolates the top FET and the bottom FET.

16. The method of manufacturing the semiconductor device according to claim 11, wherein the bottom gate contact is formed of a high-κ material.

17. The method of manufacturing the semiconductor device according to claim 11, wherein the top gate contact is laterally offset from the top FET and the bottom FET.

18. The method of manufacturing the semiconductor device according to claim 11, further comprising forming a first bonding oxide layer at a same level as the bottom gate contact.

19. The method of manufacturing the semiconductor device according to claim 11, wherein an active region of the top FET is smaller than an active region of the bottom FET.

20. The method of manufacturing the semiconductor device according to claim 11, wherein an active region of the top FET is laterally offset from an active region of the bottom FET.

* * * * *